United States Patent
Itoi et al.

(10) Patent No.: US 10,580,993 B2
(45) Date of Patent: Mar. 3, 2020

(54) AMINE COMPOUND AND ORGANIC ELECTROLUMINESCENCE DEVICE INCLUDING THE SAME

(71) Applicant: SAMSUNG DISPLAY CO., LTD., Yongin-si, Gyeonggi-do (KR)

(72) Inventors: Hiroaki Itoi, Yokohama (JP); Xiulan Jin, Yokohama (JP)

(73) Assignee: Samsung Display Co., Ltd., Yongin-si (KR)

(*) Notice: Subject to any disclaimer, the term of this patent is extended or adjusted under 35 U.S.C. 154(b) by 185 days.

(21) Appl. No.: 15/715,221

(22) Filed: Sep. 26, 2017

(65) Prior Publication Data

US 2018/0114906 A1    Apr. 26, 2018

(30) Foreign Application Priority Data

Oct. 25, 2016  (KR) .................. 10-2016-0139417

(51) Int. Cl.
  *H01L 51/50* (2006.01)
  *H01L 51/00* (2006.01)
  *C09K 11/06* (2006.01)

(52) U.S. Cl.
  CPC .......... *H01L 51/006* (2013.01); *C09K 11/06* (2013.01); *H01L 51/0058* (2013.01); *H01L 51/5012* (2013.01); *C09K 2211/1011* (2013.01); *C09K 2211/1014* (2013.01); *C09K 2211/1029* (2013.01); *C09K 2211/1088* (2013.01); *C09K 2211/1092* (2013.01); *H01L 51/5056* (2013.01)

(58) Field of Classification Search
  None
  See application file for complete search history.

(56) References Cited

U.S. PATENT DOCUMENTS

| | | |
|---|---|---|
| 9,115,055 B2 | 8/2015 | Horikiri et al. |
| 9,595,681 B2 | 3/2017 | Mujica-Fernaud et al. |
| 2003/0170491 A1* | 9/2003 | Liao .................. H01L 51/5036 428/690 |

(Continued)

FOREIGN PATENT DOCUMENTS

| | | | |
|---|---|---|---|
| CN | 102219700 | * 10/2011 | ............ C09K 11/06 |
| JP | 3838766 B2 | 10/2006 | |

(Continued)

*Primary Examiner* — Gregory D Clark
(74) *Attorney, Agent, or Firm* — Lewis Roca Rothgerber Christie LLP

(57) ABSTRACT

A amine compound and an organic electroluminescence device including the same, the amine compound being represented by Formula 1:

[Formula 1]

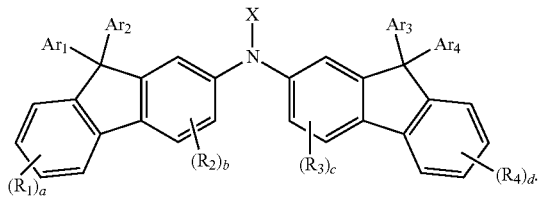

In Formula 1, at least one of $Ar_1$ to $Ar_4$ is a substituted or unsubstituted heteroaryl group.

18 Claims, 1 Drawing Sheet

(56) References Cited

U.S. PATENT DOCUMENTS

| | | | |
|---|---|---|---|
| 2006/0083946 A1* | 4/2006 | Lee | H01L 51/5048 428/690 |
| 2012/0248468 A1* | 10/2012 | Song | H01L 51/5253 257/88 |
| 2015/0207075 A1 | 7/2015 | Mujica-Fernaud et al. | |
| 2015/0329772 A1 | 11/2015 | Heil et al. | |
| 2016/0176801 A1 | 6/2016 | Kato et al. | |
| 2016/0293843 A1* | 10/2016 | Itoi | C07D 307/91 |

FOREIGN PATENT DOCUMENTS

| | | |
|---|---|---|
| JP | 2009-029726 A | 2/2009 |
| JP | 2009-267255 A | 11/2009 |
| JP | 5578832 B2 | 8/2014 |
| JP | 2015-529970 A | 10/2015 |
| JP | 2015-530735 A | 10/2015 |
| KR | 10-2015-0036721 A | 4/2015 |
| KR | 10-2015-0103241 A | 9/2015 |
| KR | 10-2016-0118123 A | 10/2016 |
| KR | 10-1694492 B1 | 1/2017 |
| KR | 10-1738607 B1 | 5/2017 |
| WO | WO 2016/006710 A1 | 1/2016 |

\* cited by examiner

AMINE COMPOUND AND ORGANIC ELECTROLUMINESCENCE DEVICE INCLUDING THE SAME

CROSS-REFERENCE TO RELATED APPLICATION

Korean Patent Application No. 10-2016-0139417, filed on Oct. 25, 2016, in the Korean Intellectual Property Office, and entitled: "Monoamine Compound and Organic Electroluminescence Device Including the Same," is incorporated by reference herein in its entirety.

BACKGROUND

1. Field

The present disclosure herein relates to an amine compound and an organic electroluminescence device including the same.

2. Description of the Related Art

Developments on an organic electroluminescence display as an image display are being actively conducted. An organic electroluminescence display is different from a liquid crystal display and is a self-luminescent display that accomplishes display by recombining holes and electrons injected from a first electrode and a second electrode in an emission layer and emitting light from a luminescent material which is an organic compound included in the emission layer.

As an organic electroluminescence device, e.g., an organic device may include a first electrode, a hole transport layer on the first electrode, an emission layer on the hole transport layer, an electron transport layer on the emission layer, and a second electrode on the electron transport layer. Holes are injected from the first electrode, and the injected holes move via the hole transport layer and injected into the emission layer. Meanwhile, electrons are injected from the second electrode, and the injected electrons move via the electron transport layer and injected into the emission layer. By recombining the injected holes and electrons into the emission layer, excitons are generated in the emission layer. An organic electroluminescence device emits light using light emitted during the transition of the excitons back to a ground state.

SUMMARY

Embodiments are directed to an amine compound and an organic electroluminescence device including the same.

The embodiments may be realized by providing an amine compound represented by the following Formula 1:

[Formula 1]

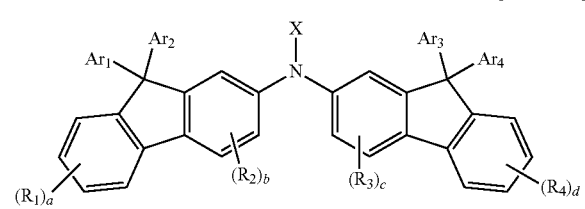

wherein in Formula 1, $Ar_1$ to $Ar_4$ are each independently a substituted or unsubstituted aryl group having 6 to 30 ring carbon atoms or a substituted or unsubstituted heteroaryl group having 2 to 30 ring carbon atoms, $Ar_1$ to $Ar_4$ are separate or are combined with an adjacent group to form a ring, $R_1$ to $R_4$ are each independently a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_1$ to $R_4$ are separate or are combined with an adjacent group to form a ring, a and d are each independently an integer of 0 to 4, b and c are each independently an integer of 0 to 3, X is a substituted or unsubstituted aryl group having 6 to 30 ring carbon atoms or a substituted or unsubstituted heteroaryl group having 2 to 30 ring carbon atoms, and at least one of $Ar_1$ to $Ar_4$ is a substituted or unsubstituted heteroaryl group having 2 to 30 ring carbon atoms.

The amine compound represented by Formula 1 may be represented by the following Formula 2:

[Formula 2]

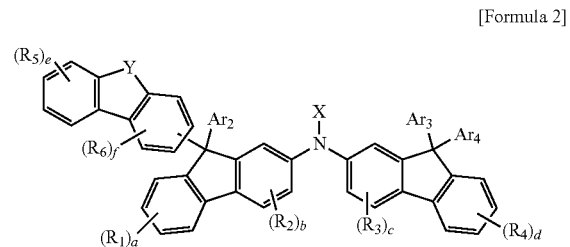

wherein in Formula 2, Y may be O, S, $SiR_7R_8$, or $NR_9$, $R_5$ to $R_9$ may be each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_5$ to $R_9$ may be separate or may be combined with an adjacent group to form a ring, e may be an integer of 0 to 4, f may be an integer of 0 to 3, and $Ar_2$ to $Ar_4$, $R_1$ to $R_4$, a to d, and X may be defined the same as those of Formula 1.

The amine compound represented by Formula 2 may be represented by the following Formula 2-1:

[Formula 2-1]

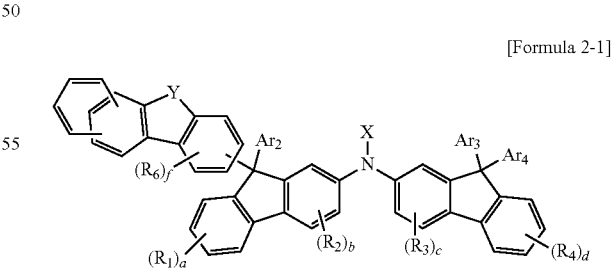

wherein in Formula 2-1, $Ar_2$ to $Ar_4$, $R_1$ to $R_4$, $R_6$, a to d, f, Y, and X may be defined the same as those of Formula 2.

$Ar_2$ may be a substituted or unsubstituted aryl group having 6 to 15 ring carbon atoms.

The amine compound represented by Formula 1 may be represented by the following Formula 3:

[Formula 3]

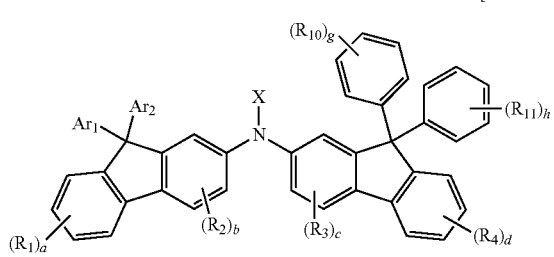

wherein in Formula 3, $R_{10}$ and $R_{11}$ may be each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, g and h may be each independently an integer of 0 to 5, $Ar_1$, $Ar_2$, X, $R_1$ to $R_4$, and a to d may be defined the same as those of Formula 1, and at least one of $Ar_1$ and $Ar_2$ may be a substituted or unsubstituted heteroaryl group having 2 to 3 ring carbon atoms.

The amine compound represented by Formula 1 may be represented by the following Formula 4:

[Formula 4]

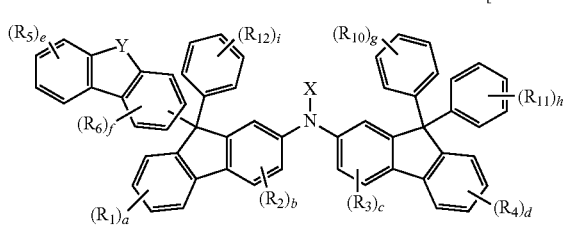

wherein in Formula 4, Y may be O, S, $SiR_7R_8$, or $NR_9$, $R_5$ to $R_{12}$ may be each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_5$ to $R_{12}$ may be separate or are combined with an adjacent group to form a ring, e may be an integer of 0 to 4, f may be an integer of 0 to 3, g to i may be each independently an integer of 0 to 5, and $R_1$ to $R_4$, a to d, and X may be defined the same as those of Formula 1.

X may be a group represented by one of the following structures:

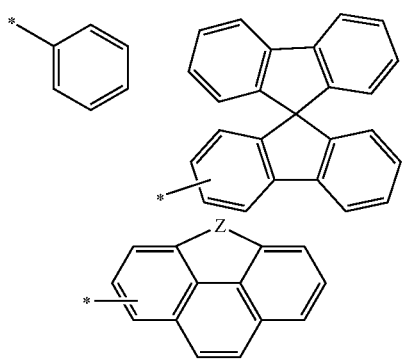

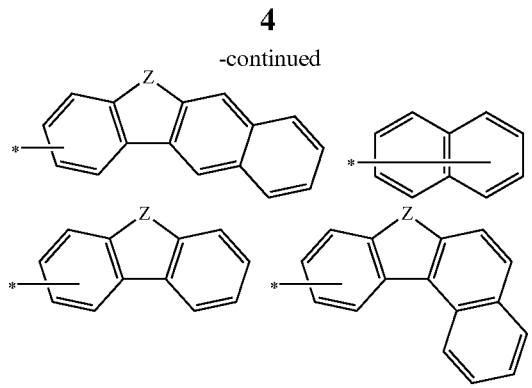

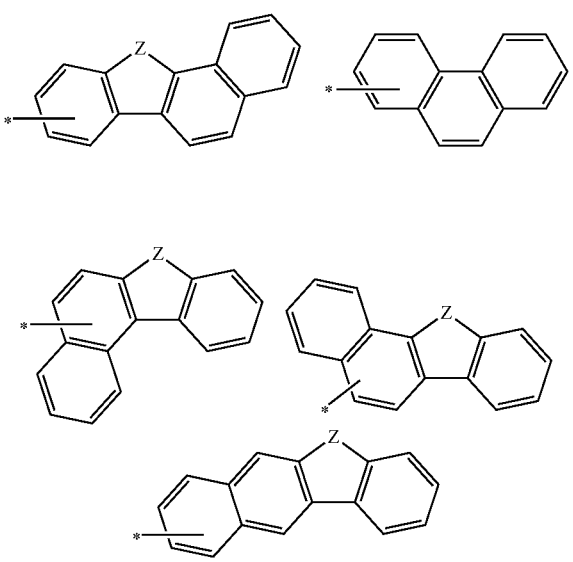

wherein, in the above structures, Z may be O, S, $NR_{13}$, $CR_{14}R_{15}$, or $SiR_{16}R_{17}$, $R_{13}$ to $R_{17}$ may be each independently a hydrogen atom, a deuterium atom a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and * is a binding site.

X may be a substituted or unsubstituted phenyl group or a substituted or unsubstituted naphthyl group.

The amine compound represented by Formula 1 may be one of the following Compounds 1 to 40:

1

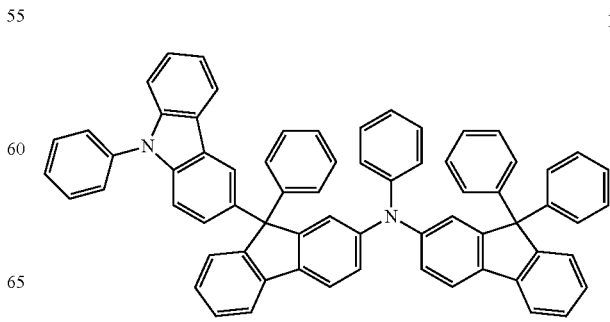

-continued
2
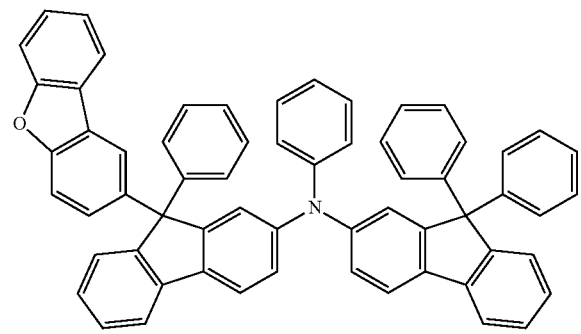
3
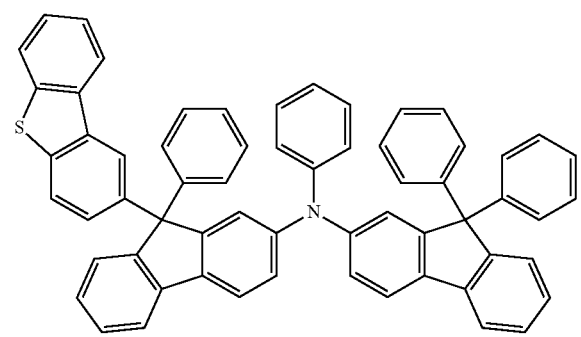
4
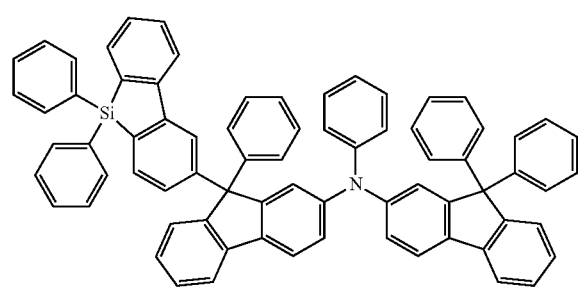
5
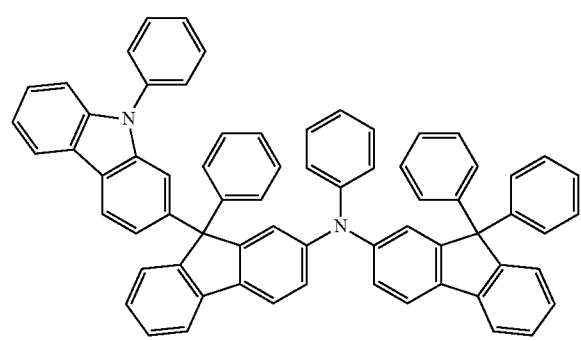
6
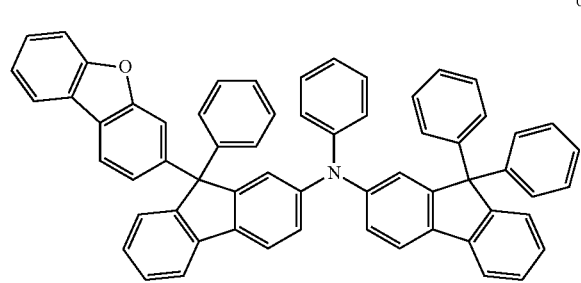
-continued
7
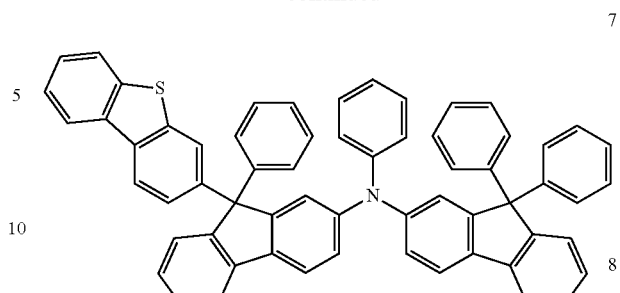
8
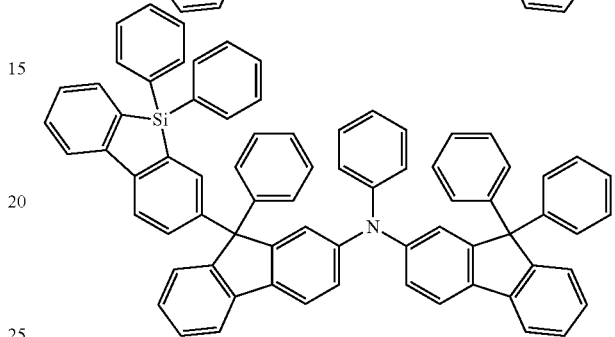
9
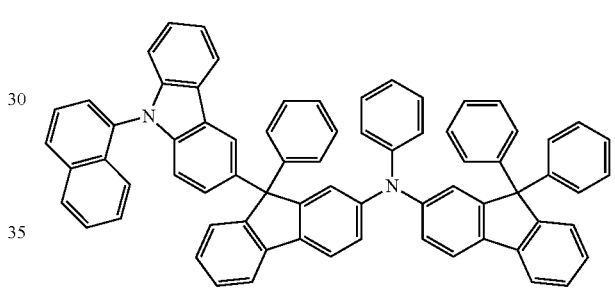
10
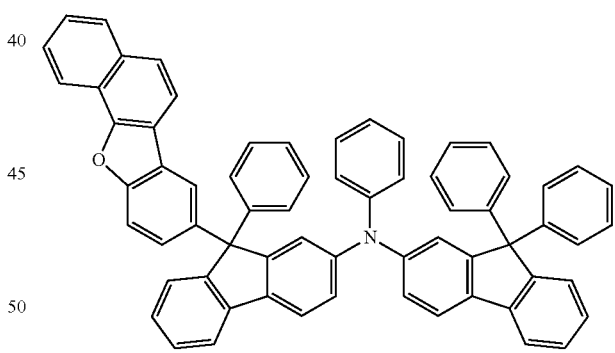
11
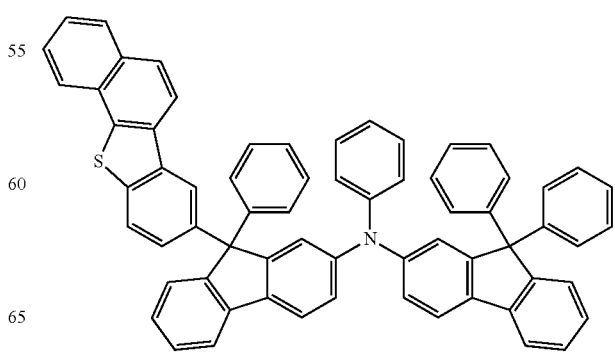

12
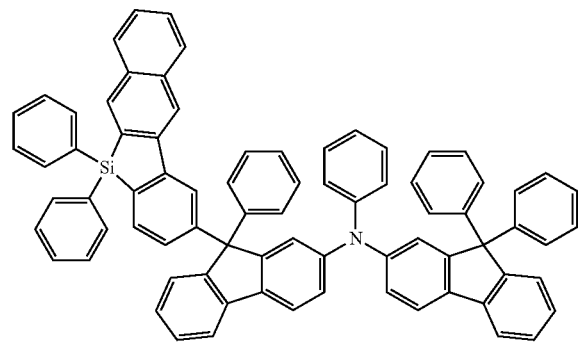
13
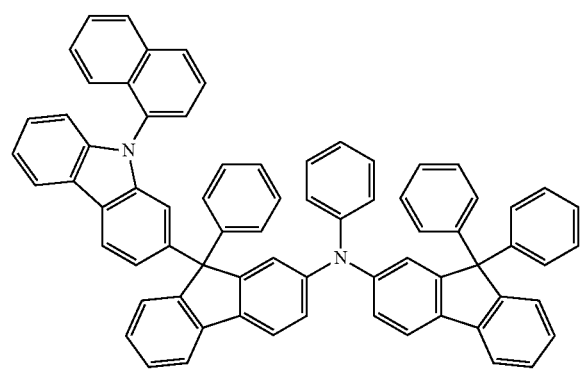
14
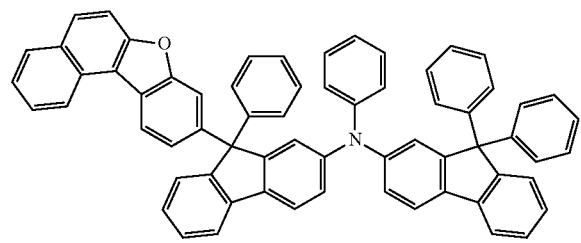
15
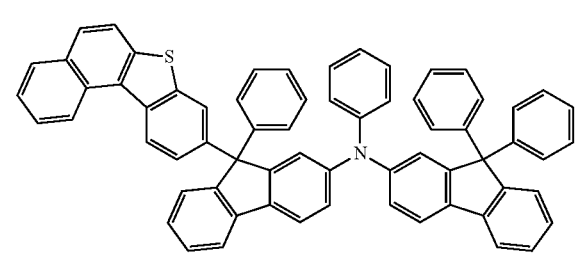
16
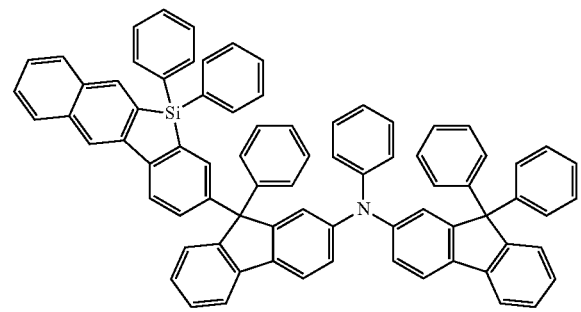
17
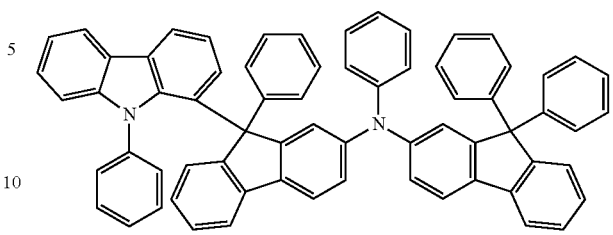
18
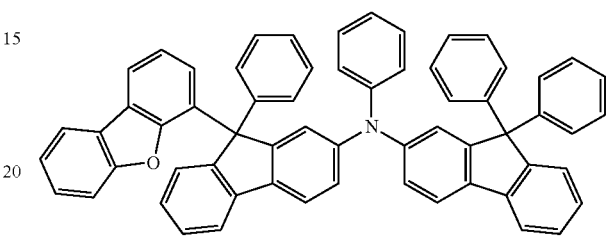
19
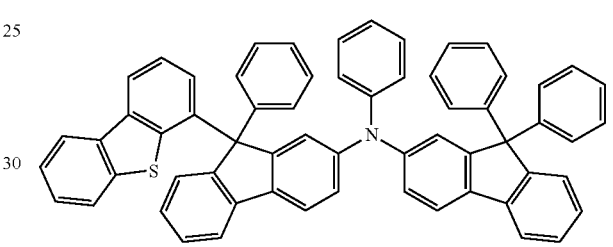
20
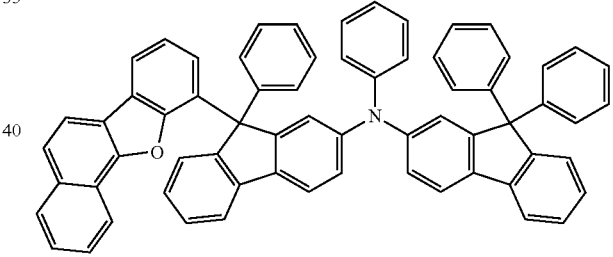
21
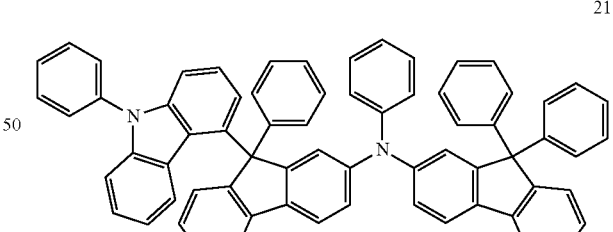
22
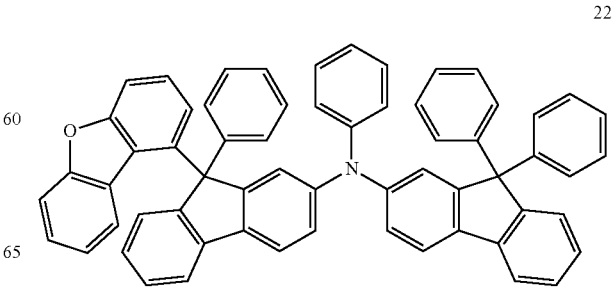

23
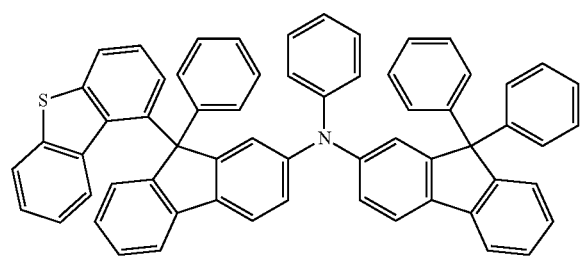
24
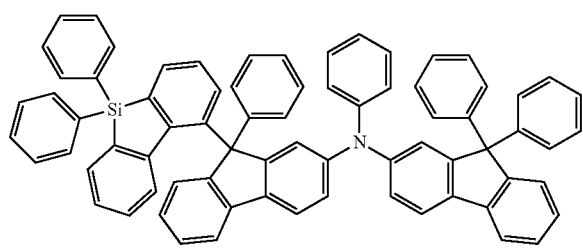
25
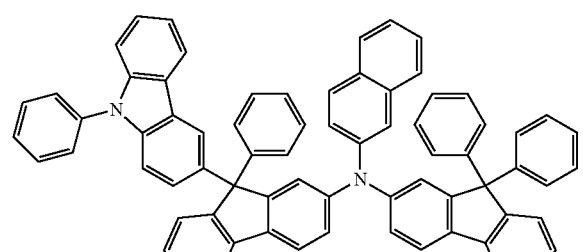
26
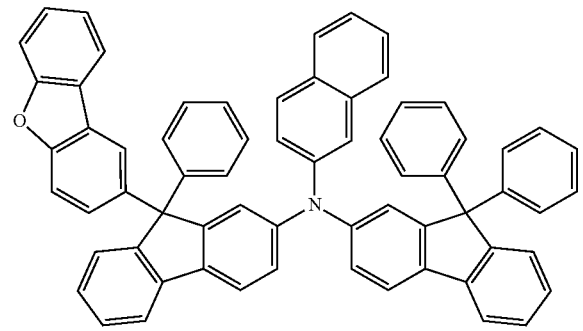
27
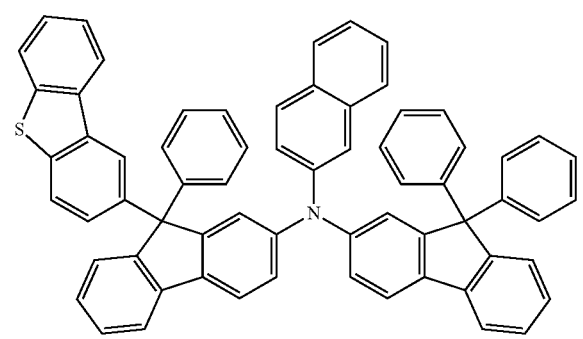
28
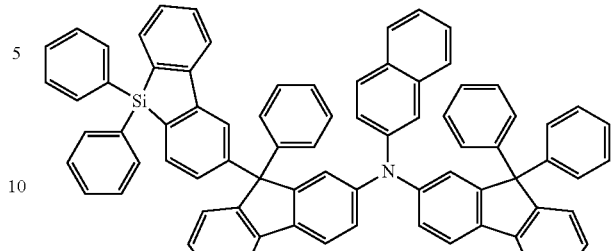
29
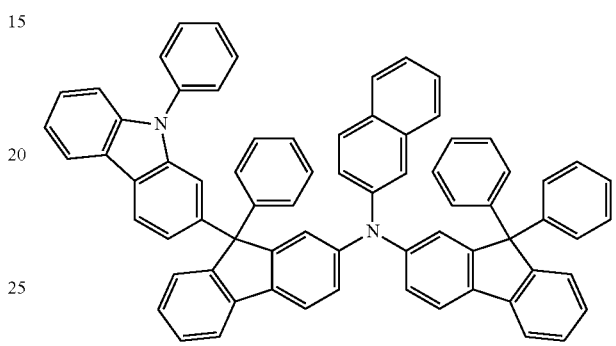
30
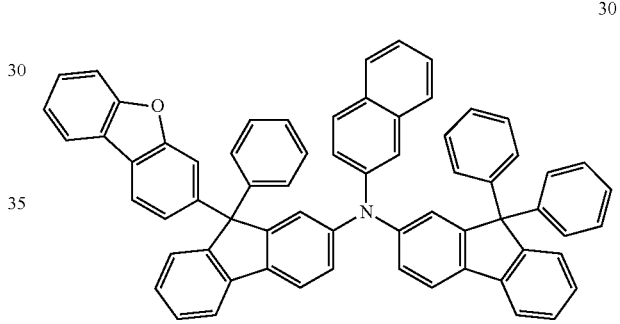
31
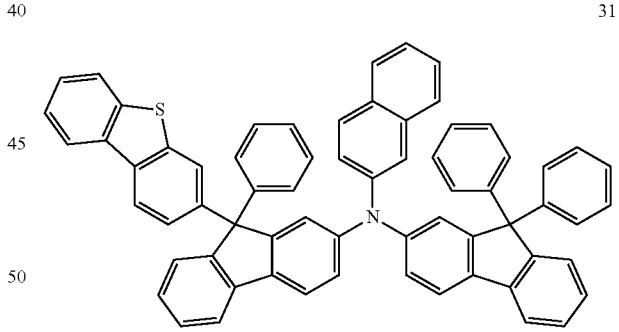
32
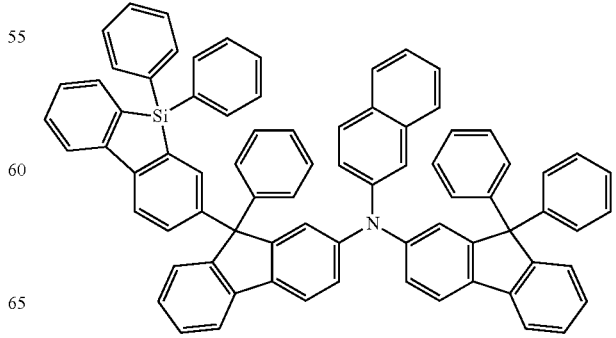

-continued

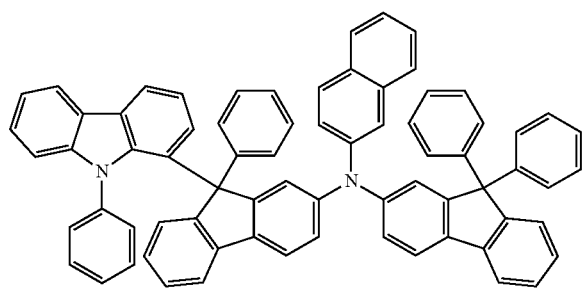
33

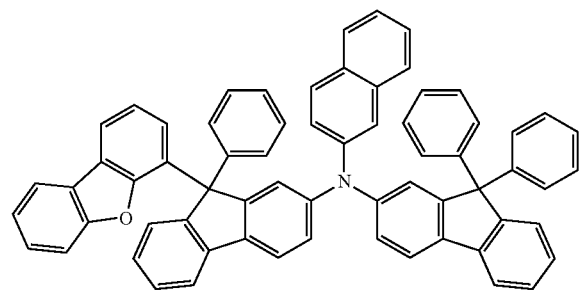
34

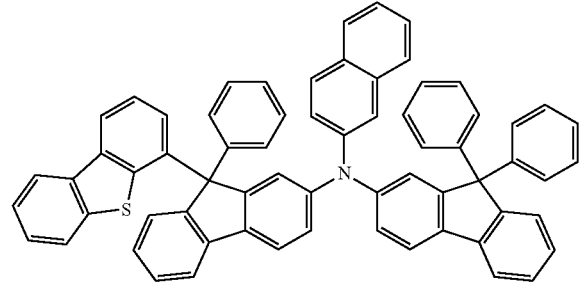
35

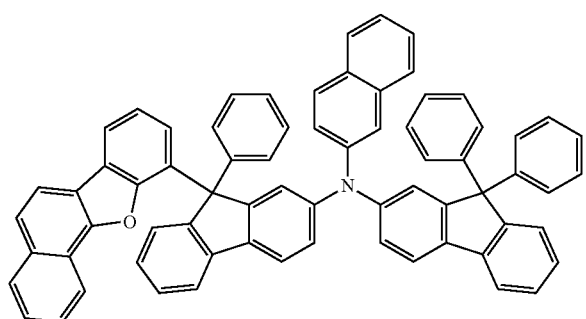
36

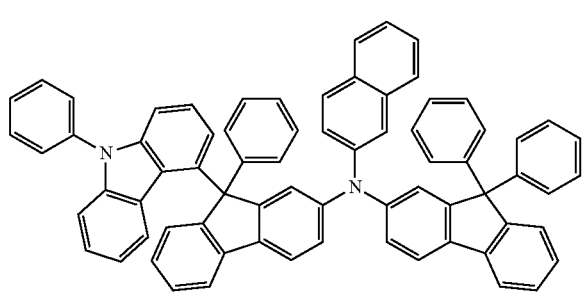
37

-continued

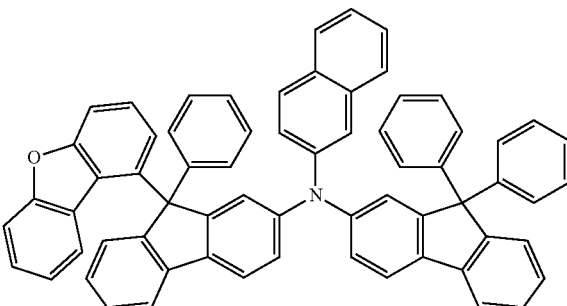
38

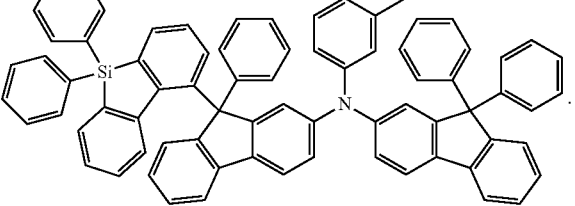
39

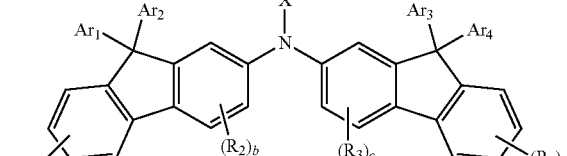
40

The embodiments may be realized by providing an organic electroluminescence device including a first electrode; a hole transport region on the first electrode; an emission layer on the hole transport region; an electron transport region on the emission layer; and a second electrode on the electron transport region, wherein the hole transport region includes an amine compound represented by the following Formula 1:

[Formula 1]

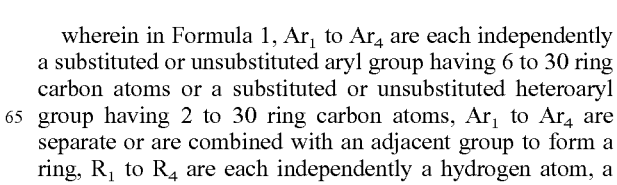

wherein in Formula 1, $Ar_1$ to $Ar_4$ are each independently a substituted or unsubstituted aryl group having 6 to 30 ring carbon atoms or a substituted or unsubstituted heteroaryl group having 2 to 30 ring carbon atoms, $Ar_1$ to $Ar_4$ are separate or are combined with an adjacent group to form a ring, $R_1$ to $R_4$ are each independently a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_1$ to $R_4$ are separate or are combined with an adjacent group to form a ring, a and d are each independently an integer of 0 to 4, b and c are each independently an integer of 0 to 3, X is a substituted or unsubstituted aryl group having 6 to 30 ring carbon atoms or a substituted or unsubstituted heteroaryl group having 2 to 30 ring carbon atoms, and at least one of $Ar_1$ to $Ar_4$ is a substituted or unsubstituted heteroaryl group having 2 to 30 ring carbon atoms.

The hole transport region may include a hole injection layer on the first electrode; and a hole transport layer on the hole injection layer, the hole transport layer may include the amine compound represented by Formula 1.

The amine compound represented by Formula 1 may be represented by the following Formula 2:

[Formula 2]

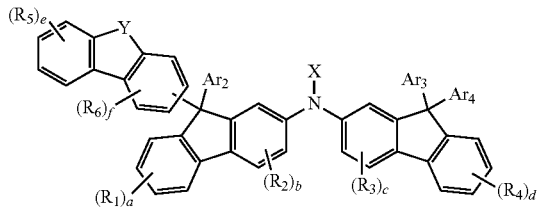

wherein in Formula 2, Y may be O, S, $SiR_7R_8$, or $NR_9$, $R_5$ to $R_9$ may be each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_5$ to $R_9$ may be separate or are combined with an adjacent group to form a ring, e may be an integer of 0 to 4, f may be an integer of 0 to 3, and $Ar_2$ to $Ar_4$, $R_1$ to $R_4$, a to d, and X may be defined the same as those of Formula 1.

The amine compound represented by Formula 2 may be represented by the following Formula 2-1:

[Formula 2-1]

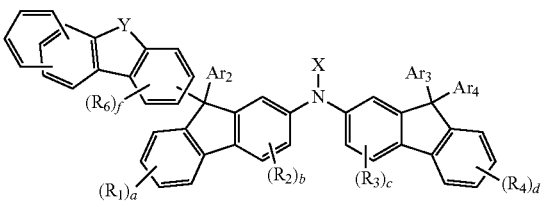

wherein in Formula 2-1, $Ar_2$ to $Ar_4$, $R_1$ to $R_4$, $R_6$, a to d, f, Y, and X may be defined the same as those of Formula 2.

The amine compound represented by Formula 1 may be represented by the following Formula 3:

[Formula 3]

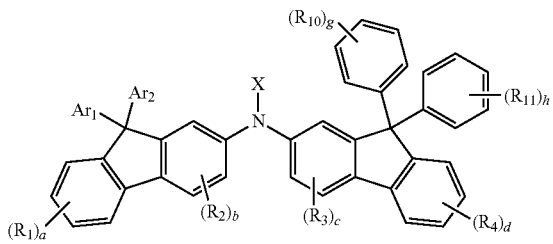

wherein in Formula 3, $R_{10}$ and $R_{11}$ may be each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, g and h may be each independently an integer of 0 to 5, $Ar_1$, $Ar_2$, X, $R_1$ to $R_4$, and a to d may be defined the same as those of Formula 1, and at least one of $Ar_1$ and $Ar_2$ may be a substituted or unsubstituted heteroaryl group having 2 to 30 ring carbon atoms.

The amine compound represented by Formula 1 may be represented by the following Formula 4:

[Formula 4]

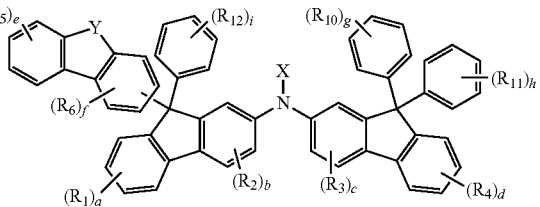

wherein in Formula 4, Y may be O, S, $SiR_7R_8$, or $NR_9$, $R_5$ to $R_{12}$ may be each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_5$ to $R_{12}$ may be separate or are combined with an adjacent group to form a ring, e may be an integer of 0 to 4, f may be an integer of 0 to 3, g to i may be each independently an integer of 0 to 5, and $R_1$ to $R_4$, a to d, and X may be defined the same as those of Formula 1.

X may be a group represented by one of the following structures:

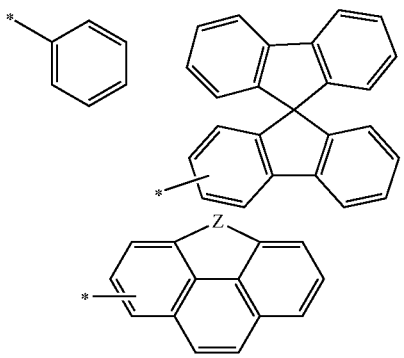

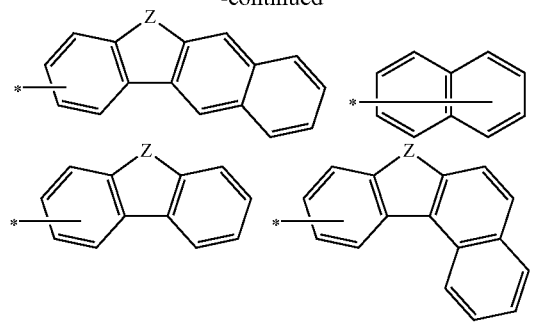

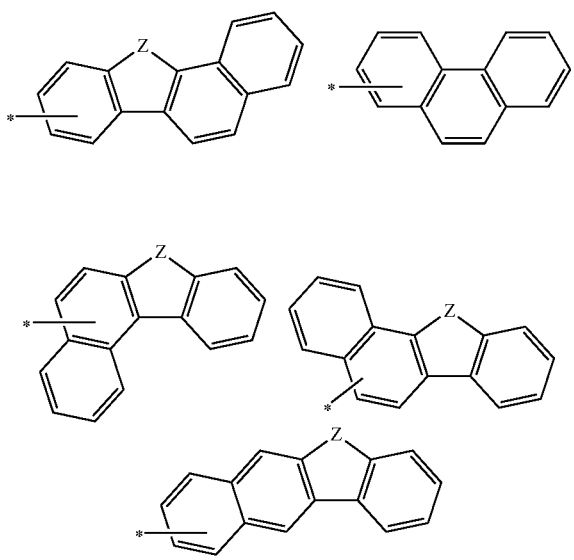

wherein, in the above structures, Z may be O, S, $NR_{13}$, $CR_{14}R_{15}$, or $SiR_{16}R_{17}$, $R_{13}$ to $R_{17}$ may be each independently a hydrogen atom, a deuterium atom a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and * is a binding site.

X is a substituted or unsubstituted phenyl group or a substituted or unsubstituted naphthyl group.

The amine compound represented by Formula 1 may be one of the following Compounds 1 to 40:

1

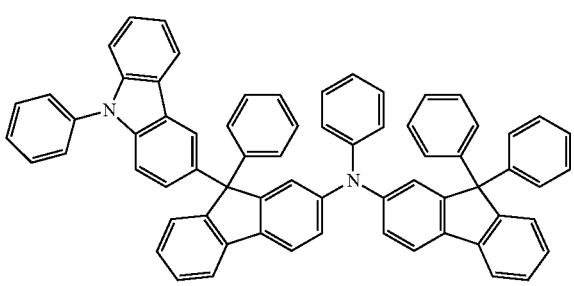

2

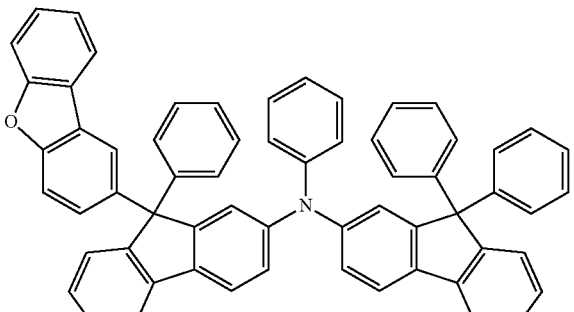

3

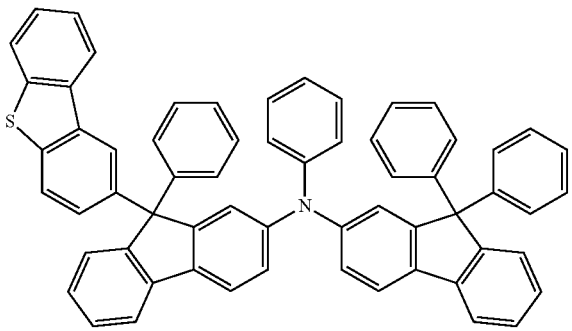

4

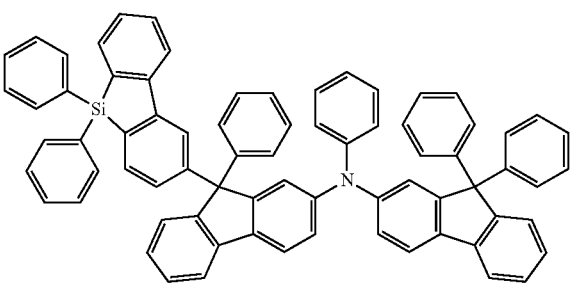

5

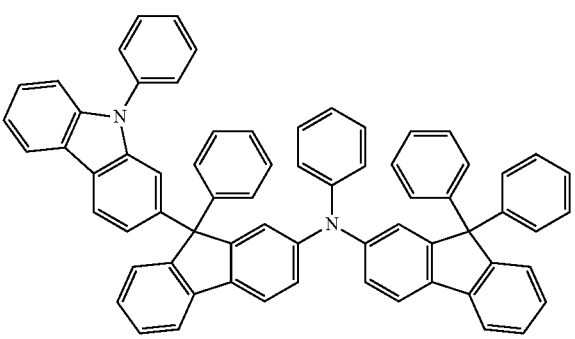

6

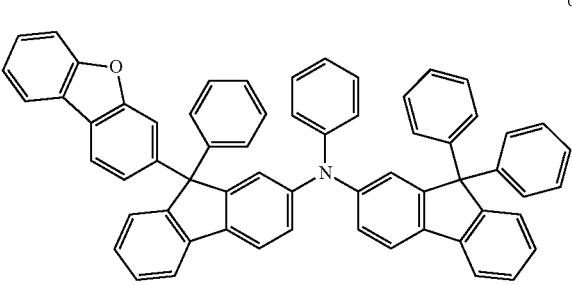

7
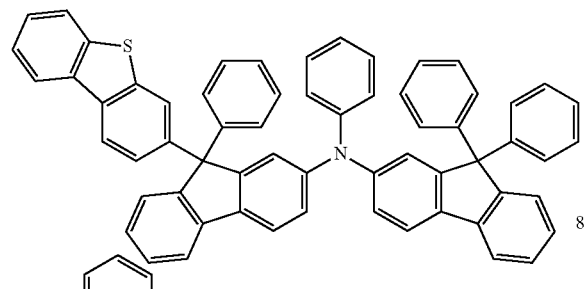
8
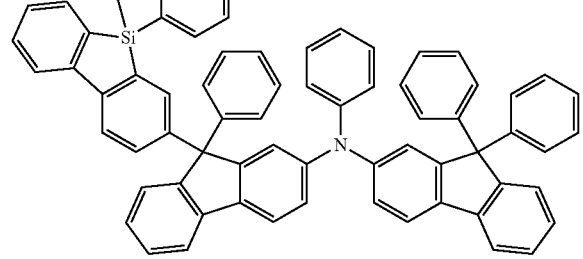
9
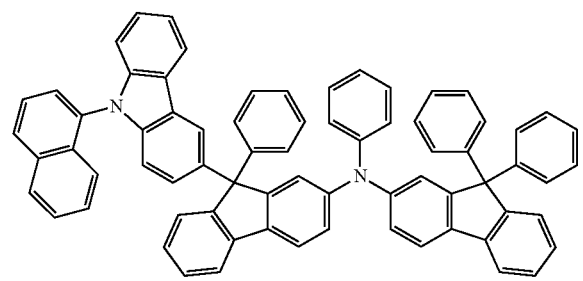
10
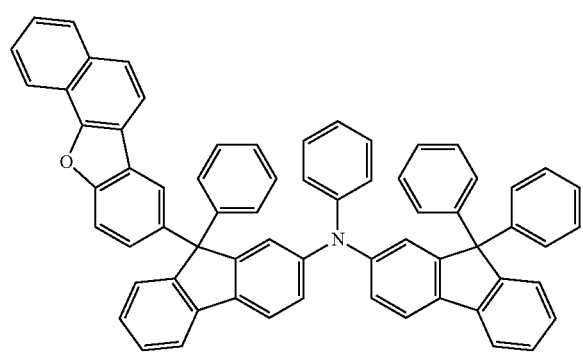
11
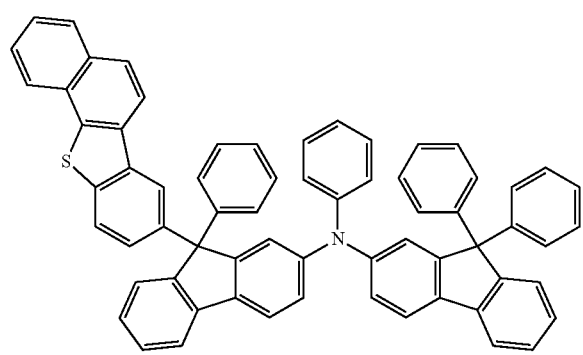
12
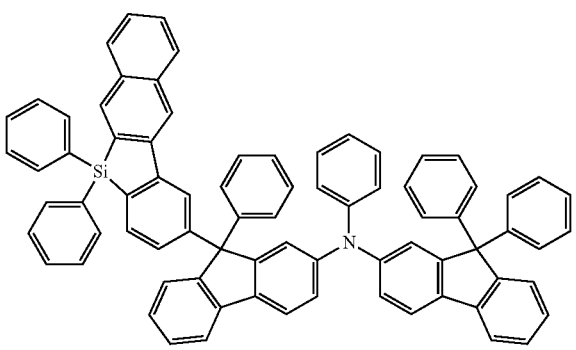
13
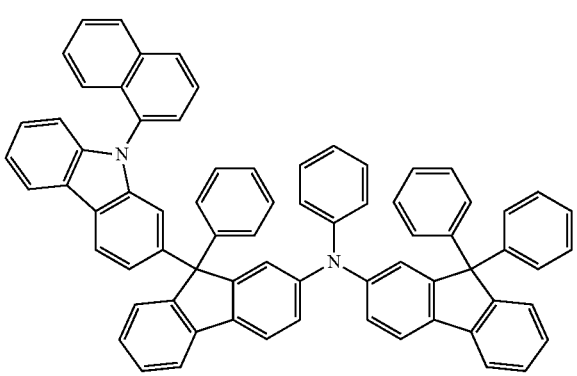
14
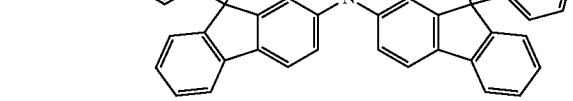
15
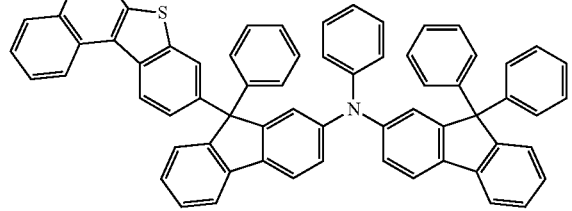
16
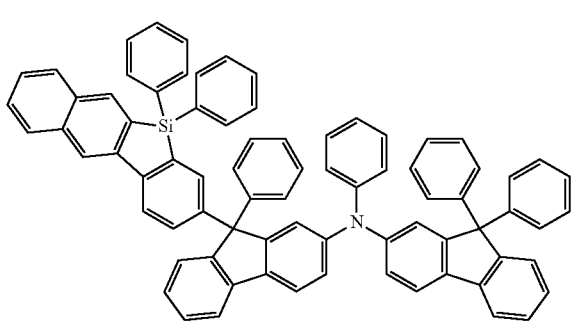

17
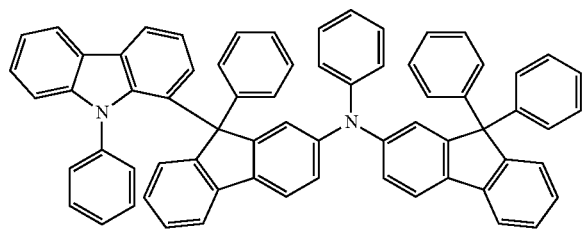
18
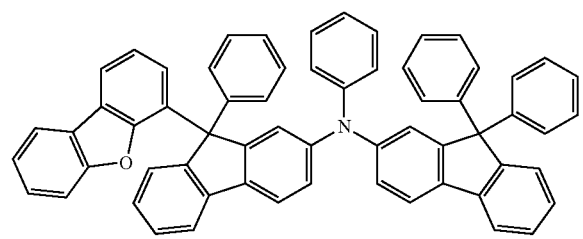
19
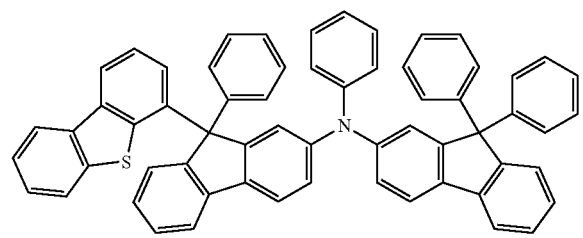
20
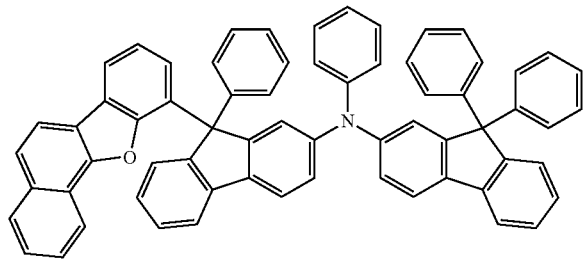
21
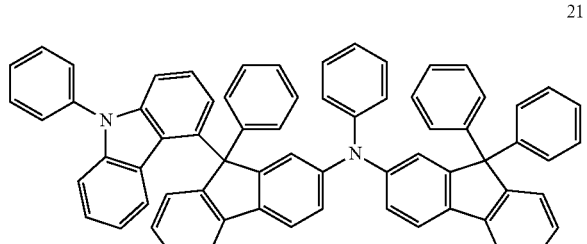
22
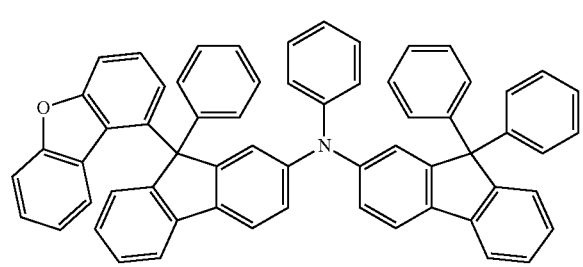
23
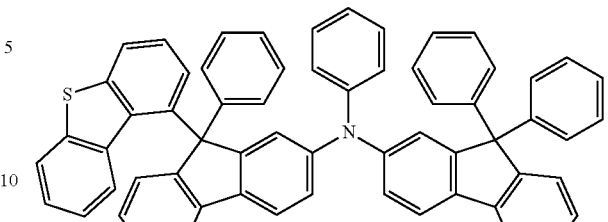
24
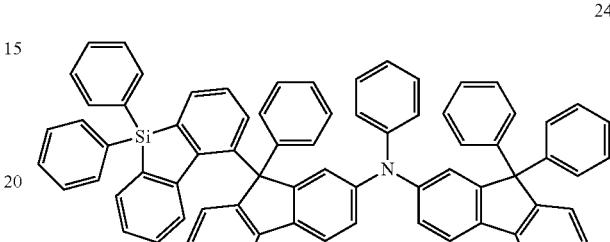
25
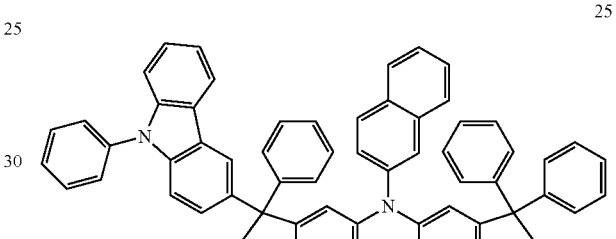
26
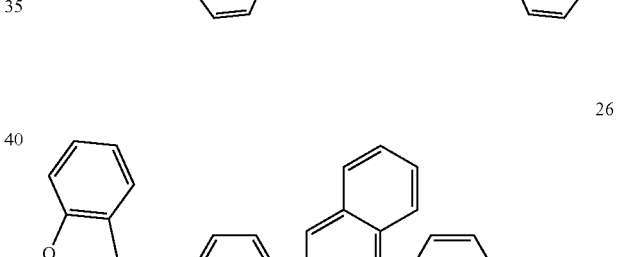
27
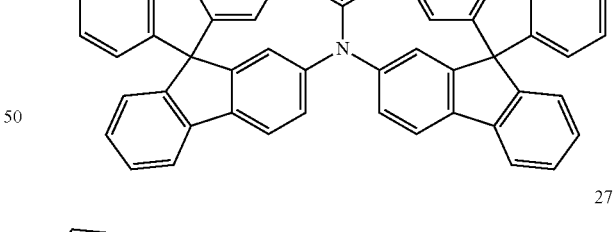

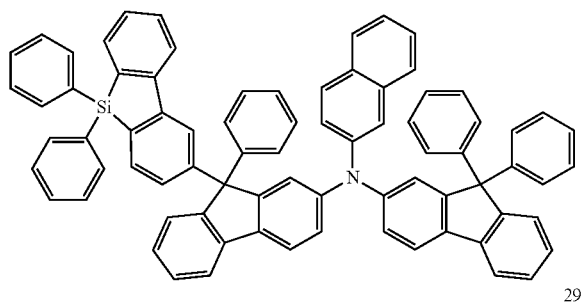
28
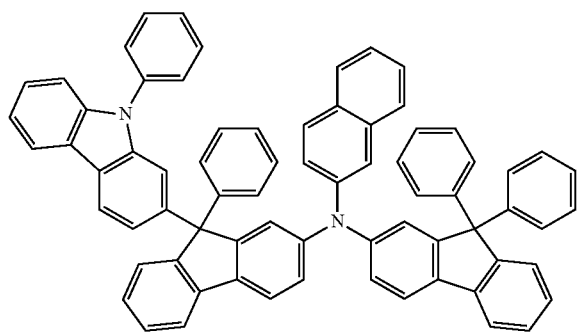
29
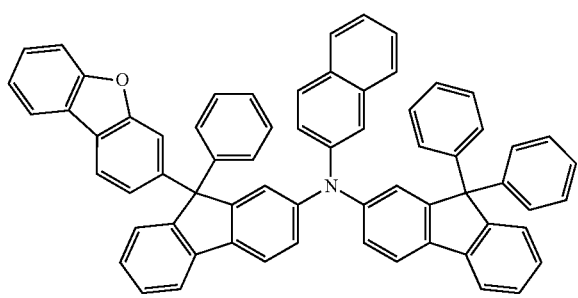
30
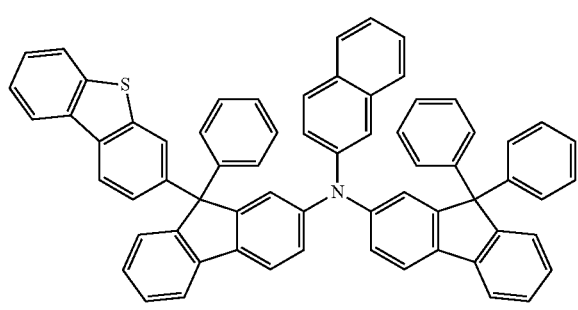
31
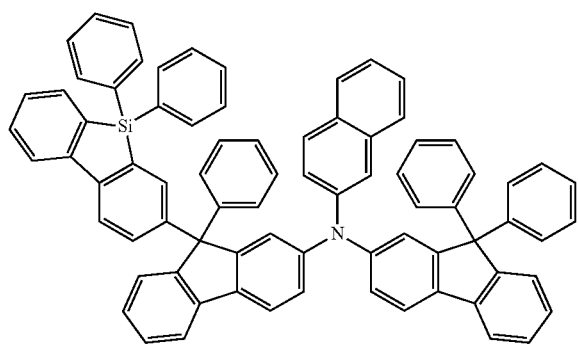
32
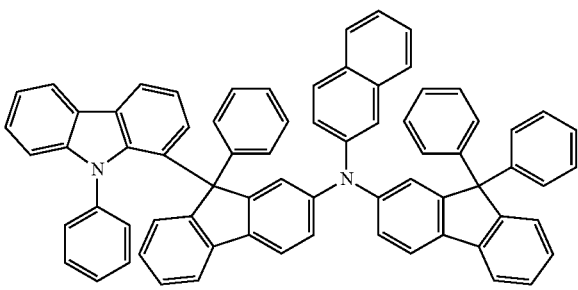
33
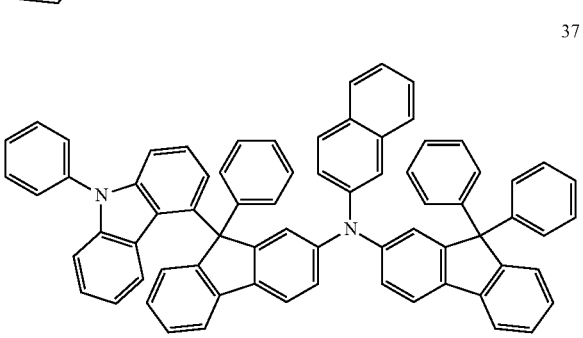
37

-continued

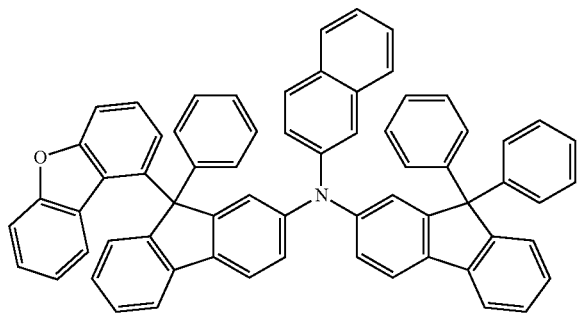

38

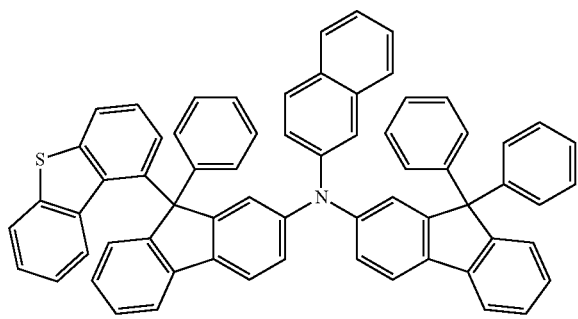

39

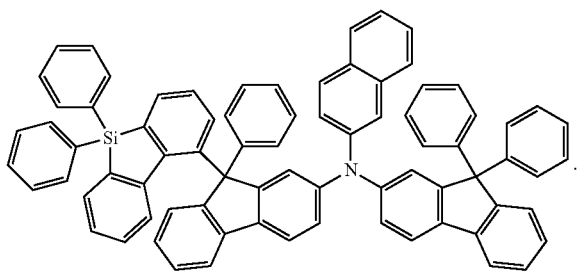

40

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
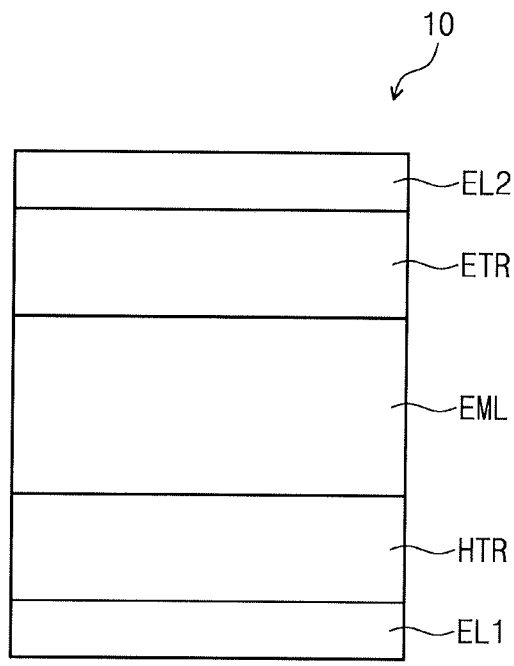
FIG. 1 illustrates a schematic cross-sectional view of an organic electroluminescence device according to an embodiment of the present disclosure.

The above objects, other objects, features and advantages of the present disclosure will be easily understood from preferred exemplary embodiments with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

Like reference numerals refer to like elements for explaining each drawing. In the drawings, the sizes of elements may be enlarged for clarity of the present disclosure. It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "includes," "including," "comprises" or "comprising," when used in this specification, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc. is referred to as being 'on' another part, it can be directly on the other part, or intervening layers may also be present. When a layer, a film, a region, a plate, etc. is referred to as being 'under' another part, it can be directly under the other part, or intervening layers may also be present.

In the present disclosure, ——* means a position to be connected, e.g., * is a binding site.

In the present disclosure, "substituted or unsubstituted" may mean substituted with at least one substituent selected from the group of deuterium, halogen, cyano, nitro, amino, silyl, boron, phosphine oxide, phosphine sulfide, alkyl, alkenyl, aryl, and heteroaryl or unsubstituted. In addition, each substituent illustrated above may be substituted or unsubstituted. For example, biphenyl may be interpreted as aryl, or phenyl substituted with phenyl.

In the present disclosure, the description of forming a ring by combining adjacent groups with each other may mean forming a substituted or unsubstituted hydrocarbon ring, or a substituted or unsubstituted heterocycle by combining adjacent groups with each other. The hydrocarbon ring may include an aliphatic hydrocarbon ring and an aromatic hydrocarbon ring. The heterocycle may include an aliphatic heterocycle and aromatic heterocycle. The hydrocarbon ring and heterocycle may be a monocycle or polycycle. In addition, the ring formed by combining adjacent groups may be connected with another ring to form a spiro structure.

In the present disclosure, the terms "an adjacent group" may mean a substituent at an atom which is directly connected with another atom at which a corresponding substituent is substituted, another substituent at an atom at which a corresponding substituent is substituted, or a substituent stereoscopically disposed at the nearest position to a corresponding substituent. For example, two methyl groups in 1,2-dimethylbenzene may be interpreted as "adjacent groups", and two ethyl groups in 1,1-diethylcyclopentene may be interpreted as "adjacent groups".

In the present disclosure, a halogen atom may include a fluorine atom, a chlorine atom, a bromine atom, or an iodine atom.

In the present disclosure, the alkyl may have a linear, branched, or cyclic shape. The carbon number of the alkyl may be 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present disclosure, the aryl means a functional group or substituent derived from an aromatic hydrocarbon ring. The aryl may be monocyclic aryl or polycyclic aryl. The carbon number of the aryl for forming a ring may be 6 to 30, 6 to 20, or 6 to 15. Examples of the aryl may include phenyl, naphthyl, fluorenyl, anthracenyl, phenanthryl, biphenyl, terphenyl, quaterphenyl, quinqphenyl, sexiphenyl, triphenylene, pyrenyl, benzofluoranthenyl, chrysenyl, etc., without limitation.

In the present disclosure, the fluorenyl may be substituted, or two substituents may be combined with each other to form a spiro structure.

In the present disclosure, the heteroaryl may be heteroaryl including at least one of O, N, P, Si or S as a heteroatom. The carbon number of the heteroaryl for forming a ring may be 2 to 30, or 2 to 20. The heteroaryl may be monocyclic heteroaryl or polycyclic heteroaryl. The polycyclic heteroaryl may have, for example, a bicyclic or tricyclic structure. Examples of the heteroaryl may include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidinyl, pyrido pyrazinyl, pyrazino pyrazinyl, isoquinoline, indole, carbazole, N-arylcarbazole, N-heteroaryl carbazole, N-alkyl carbazole, benzoxazole, benzoimidazole, benzothiazole, benzocarbazole, benzothiophene, dibenzothiophenyl, thienothiophene, benzofuranyl, phenanthroline, thiazolyl, isooxazolyl, oxadiazolyl, thiadiazolyl, benzothiazolyl, phenothiazinyl, dibenzosilole, dibenzofuranyl, etc., without limitation.

In the present disclosure, the explanation on the above-described aryl may be applied to the arylene except that the arylene is divalent.

In the present disclosure, the explanation of the heteroaryl may be applied to the heteroarylene except that the heteroarylene is divalent.

In the present disclosure, the silyl may include alkyl silyl and aryl silyl. Examples of the silyl may include trimethylsilyl, triethylsilyl, t-butyl dimethylsilyl, vinyl dimethylsilyl, propyl dimethylsilyl, triphenylsilyl, diphenylsilyl, phenylsilyl, etc., without limitation.

In the present disclosure, the boron may include alkyl boron and aryl boron. Examples of the boron may include trimethyl boron, triethyl boron, t-butyl dimethyl boron, triphenyl boron, diphenyl boron, phenyl boron, etc., without limitation.

In the present disclosure, the alkenyl may be linear or branched. The carbon number is not specifically limited, however may be 2 to 30, 2 to 20, or 2 to 10. Examples of the alkenyl may include vinyl, 1-butenyl, 1-pentenyl, 1,3-butadienyl aryl, styrenyl, styrylvinyl, etc., without limitation.

In the present disclosure, the carbon number of the amino is not specifically limited, however may be 1 to 30. The amino may include alkylamino and arylamino. Examples of the amino may include methylamino, dimethylamino, phenylamino, diphenylamino, naphthylamino, 9-methyl-anthracenylamino, triphenylamino, etc., without limitation.

Hereinafter, the amine compound, e.g., a monoamine compound, according to an embodiment of the present disclosure will be explained.

The amine compound according to an embodiment of the present disclosure may be represented by the following Formula 1.

[Formula 1]

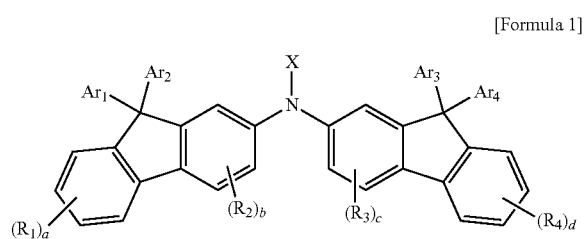

In Formula 1, $Ar_1$ to $Ar_4$ may each independently be or include, e.g., a substituted or unsubstituted aryl group having 6 to 30 ring carbon atoms or a substituted or unsubstituted heteroaryl group having 2 to 30 ring carbon atoms. In an implementation, any one of $Ar_1$ to $Ar_4$ may combine with an adjacent group to form a ring. $R_1$ to $R_4$ may each independently be or include, e.g., a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. In an implementation, any one of $R_1$ to $R_4$ may combine with an adjacent group to form a ring. "a" and "d" may each independently be, e.g., an integer of 0 to 4 and "b" and "c" may each independently be, e.g., an integer of 0 to 3. X may be or may include, e.g., a substituted or unsubstituted aryl group having 6 to 30 ring carbon atoms or a substituted or unsubstituted heteroaryl group having 2 to 30 ring carbon atoms. In an implementation, at least one of $Ar_1$ to $Ar_4$ may be or may include, e.g., a substituted or unsubstituted heteroaryl group having 2 to 30 ring carbon atoms.

In the case where "a" is 2, 3, or 4, the 2, 3, or 4 $R_1$ may be the same or different. In the case where "b" is 2 or 3, the 2 or 3 $R_2$ may be the same or different. In the case where "c" is 2 or 3, the 2 or 3 $R_3$ may be the same or different. In the case where "d" is 2, 3, or 4, the 2, 3, or 4 $R_4$ may be the same or different.

In an implementation, "a" to "d" may be each independently 0. In an implementation, a relation of a+b+c+d≥1 may be satisfied.

In an implementation, one of $Ar_1$ to $Ar_4$ may be or may include, e.g., a substituted or unsubstituted heteroaryl group. In an implementation, one of $Ar_1$ to $Ar_4$ may be or may include, e.g., a substituted or unsubstituted polycyclic heteroaryl group. In an implementation, the amine compound represented by Formula 1 may be represented by the following Formula 2.

[Formula 2]

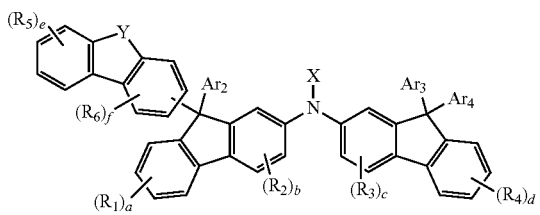

In Formula 2, Y may be, e.g., O, S, SiR₇R₈, or NR₉. R₅ to R₉ may each independently be or include, e.g., a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. In an implementation, R₅ to R₉ may be separate or may combine with an adjacent group to form a ring. "e" may be, e.g., an integer of 0 to 4 and "f" may be, e.g., an integer of 0 to 3. Ar₂ to Ar₄, R₁ to R₄, "a" to "d", and X may be the same as described above.

In the case where "e" is 2, 3, or 4, the 2, 3, or 4 R₅ are the same or different. In the case where "f" is 2 or 3, the 2 or 3 R₆ are the same or different.

In an implementation, in Formula 2, Ar₂ may be or may include, e.g., a substituted or unsubstituted aryl group having 6 to 30 ring carbon atoms. In an implementation, in Formula 2, Ar₂ may be or may include, e.g., a substituted or unsubstituted aryl group having 6 to 15 ring carbon atoms. In an implementation, in Formula 2. Ar₂ may be or may include, e.g., a substituted or unsubstituted monocyclic aryl group. In an implementation, in Formula 2, Ar₂ may be or may include, e.g., a substituted or unsubstituted phenyl group. In an implementation, in Formula 2, Ar₂ may be, e.g., an unsubstituted phenyl group.

In an implementation, in Formula 2, Y may be, e.g., SiR₇R₈, and R₇ and R₈ may each independently be or include, e.g., a substituted or unsubstituted aryl group having 6 to 30 ring carbon atoms or a substituted or unsubstituted heteroaryl group having 2 to 30 ring carbon atoms. In an implementation, R₇ and R₈ may each independently be or include, e.g., a substituted or unsubstituted aryl group having 6 to 30 ring carbon atoms. In an implementation, R₇ and R₈ may each independently be or include a substituted or unsubstituted phenyl group, e.g., an unsubstituted phenyl group.

In an implementation, in Formula 2, Y may be, e.g., NR₉, and R₉ may be or may include, e.g., a substituted or unsubstituted aryl group having 6 to 30 ring carbon atoms or a substituted or unsubstituted heteroaryl group having 2 to 30 ring carbon atoms. In an implementation, R₉ may be or may include, e.g., a substituted or unsubstituted aryl group having 6 to 30 ring carbon atoms. In an implementation, R₉ may be or may include, e.g., a substituted or unsubstituted aryl group having 6 to 15 ring carbon atoms. In an implementation, R₉ may be or may include, e.g., a substituted or unsubstituted naphthyl group or a substituted or unsubstituted phenyl group.

In an implementation, in Formula 2, Y may be, e.g., O or S.

In an implementation, in Formula 2, "e" may be 2, 3, or 4, and adjacent R₅ groups may be combined with each other to form a ring. In an implementation, adjacent R₅ groups may be combined with each other to form an aromatic hydrocarbon ring. In an implementation, the amine compound represented by Formula 2 may be represented by the following Formula 2-1.

[Formula 2-1]

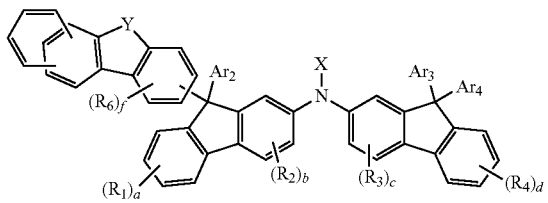

In Formula 2-1, Ar₂ to Ar₄, R₁ to R₄, R₆, "a" to "d", "f", Y, and X may be the same as described above.

In an implementation, in Formula 2-1, "a" to "d" and "f" may be 0.

In an implementation, the amine compound represented by Formula 2-1 may be represented by one of the following Formulae 2-1-1 to 2-1-3.

[Formula 2-1-1]

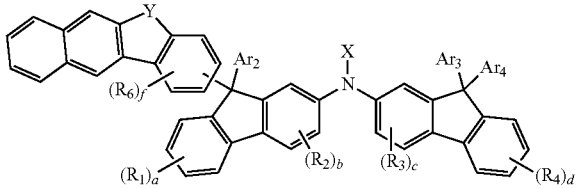

[Formula 2-1-2]

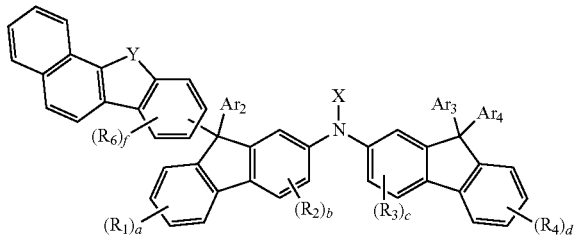

[Formula 2-1-3]

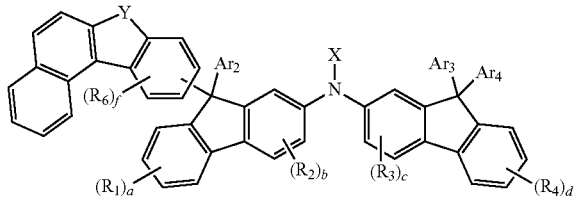

In Formulae 2-1-1 to 2-1-3, Ar₂ to Ar₄, R₁ to R₄, R₆, "a" to "d", "f", Y, and X may be the same as described above.

In an implementation, in Formulae 2-1-1 to 2-1-3, Y may be O, S, or SiR₇R₈.

In an implementation, the amine compound represented by Formulae 2 may be represented by one of the following Formulae 2-2 to 2-5.

[Formula 2-2]

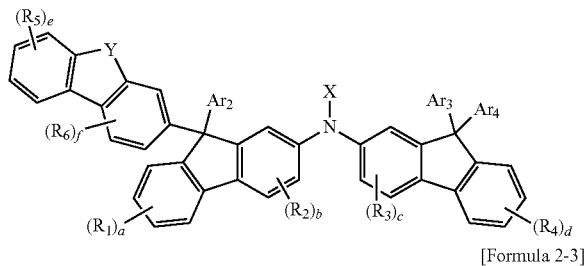

[Formula 2-3]

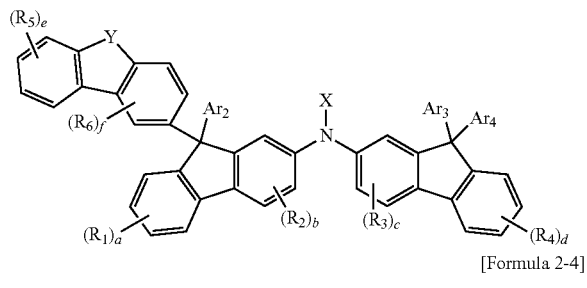

[Formula 2-4]

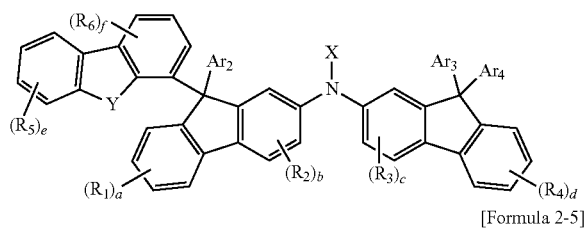

[Formula 2-5]

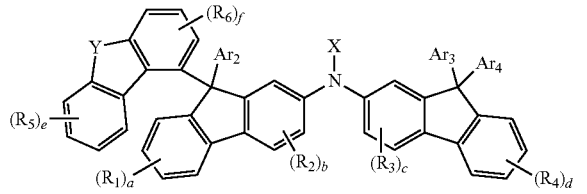

In Formulae 2-2 to 2-5, $Ar_2$ to $Ar_4$, $R_1$ to $R_6$, "a" to "f", Y, and X may be the same as described above.

In an implementation, the amine compound represented by Formula 1 may be represented by the following Formula 3.

[Formula 3]

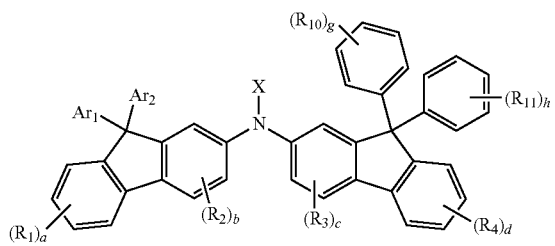

In Formula 3, $R_{10}$ and $R_{11}$ may each independently be or include, e.g., a hydrogen atom, a deuterium atom, a substituted or unsubstituted alkyl group having 1 to 20 carbon atoms, a substituted or unsubstituted aryl group having 6 to 30 ring carbon atoms or a substituted or unsubstituted heteroaryl group having 2 to 30 ring carbon atoms. "g" and "h" may each independently be, e.g., an integer of 0 to 5. $Ar_1$, $Ar_2$, X, $R_1$ to $R_4$, and "a" to "d" may be the same as described above. In an implementation, at least one of $Ar_1$ and $Ar_2$ may be or may include, e.g., a substituted or unsubstituted heteroaryl group having 2 to 30 ring carbon atoms.

In the case where "g" is 2, 3, 4, or 5, the 2, 3, 4, or 5 $R_{11}$ are the same or different. In the case where "h" is 2, 3, 4, or 5, the 2, 3, 4, or 5 $R_{11}$ are the same or different. In an implementation, "g" and "h" may be 0. In an implementation, a relation of g+h≥1 may be satisfied.

In an implementation, in Formula 3, one of $Ar_1$ and $Ar_2$ may be or include, e.g., a substituted or unsubstituted heteroaryl group having 2 to 30 ring carbon atoms, and the remaining group or other one may be or may include, e.g., a substituted or unsubstituted aryl group having 6 to 30 ring carbon atoms.

In an implementation, in Formula 3, one of $Ar_1$ and $Ar_2$ may be or may include, e.g., a substituted or unsubstituted polycyclic heteroaryl group and the remaining group or other one may be or may include, e.g., a substituted or unsubstituted monocyclic aryl group. In an implementation, in Formula 3, one of $Ar_1$ and $Ar_2$ may be or may include, e.g., a substituted or unsubstituted heteroaryl group having a tricyclic structure, and the remaining group or other one may be or may include, e.g., a substituted or unsubstituted monocyclic aryl group.

In an implementation, in Formula 3, one of $Ar_1$ and $Ar_2$ may be or may include, e.g., a substituted or unsubstituted heteroaryl group having 2 to 30 ring carbon atoms, and the remaining group or other one may be or may include a substituted or unsubstituted phenyl group.

In an implementation, the amine compound represented by Formula 1 may be represented by the following Formula 4.

[Formula 4]

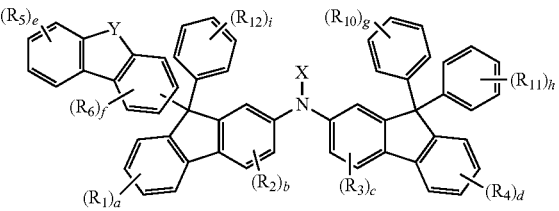

In Formula 4. Y may be, e.g., O, S, $SiR_7R_8$, or $NR_9$. $R_5$ to $R_{12}$ may each independently be or include, e.g., a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. In an implementation, $R_5$ to $R_{12}$ may be separate or may combine with an adjacent group to form a ring. "e" may be, e.g., an integer of 0 to 4, "f" may be, e.g., an integer of 0 to 3, "g" to "i" may each independently be, e.g., an integer of 0 to 5. $R_1$ to $R_4$, "a" to "d", and X may be the same as described above. In the case where "i" is 2, 3, 4, or 5, the 2, 3, 4, or 5 $R_{12}$ are the same or different.

In an implementation, in Formula 4, "a" to "d", "f", "g", "h" and "i" may be 0.

In an implementation, in Formula 4, X may be or may include, e.g., a substituted or unsubstituted aryl group having 6 to 30 ring carbon atoms, e.g., a substituted or unsubstituted aryl group having 6 to 15 ring carbon atoms. In an implementation, in Formula 4, X may be or may include, e.g., a substituted or unsubstituted phenyl group or a substituted or unsubstituted naphthyl group. In an implementation, in Formula 4, X may be or may include, e.g., an unsubstituted phenyl group or an unsubstituted naphthyl group.

In an implementation, in Formula 1, X may be or may include, e.g., a group or moiety represented by one of the following structures (e.g., each structure may be substituted or unsubstituted).

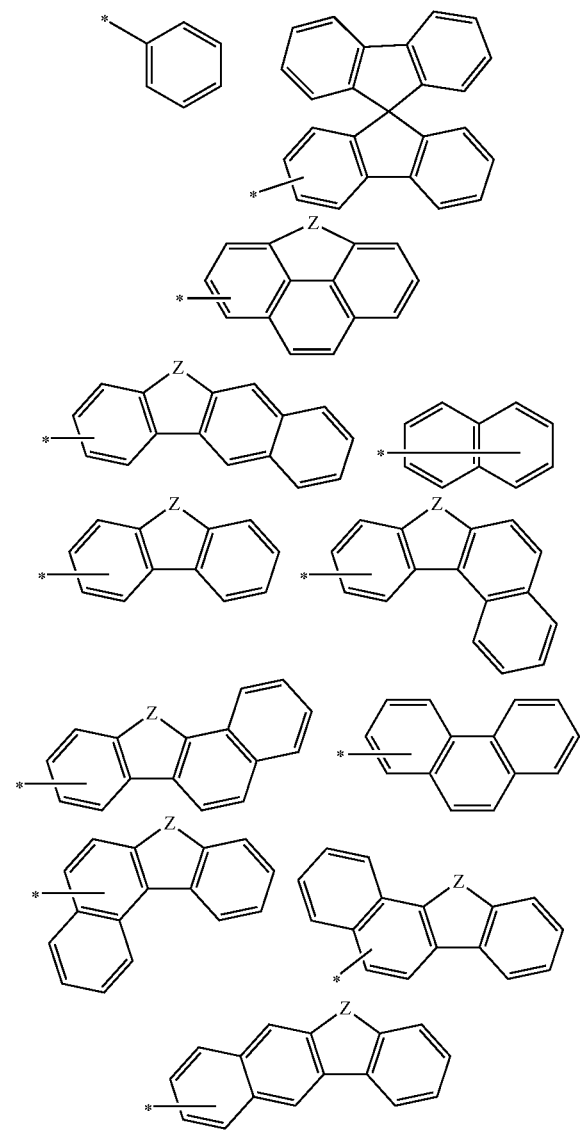

In the structures, Z may be, e.g., O, S, $NR_{13}$, $CR_{14}R_{15}$, or $SiR_{16}R_{17}$. $R_{13}$ to $R_{17}$ may each independently be or include, e.g., a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

If the structure is substituted, a substituent may include at least one selected from the group of a deuterium atom, a halogen atom, a cyano group, a substituted or unsubstituted alkyl group having 1 to 10 carbon atoms, a substituted or unsubstituted aryl group having 6 to 30 ring carbon atoms, and a substituted or unsubstituted heteroaryl group having 2 to 30 ring carbon atoms.

In an implementation, in Formula 1, X may be or may include, e.g., a substituted or unsubstituted aryl group having 6 to 30 ring carbon atoms, e.g., a substituted or unsubstituted aryl group having 6 to 15 ring carbon atoms.

In an implementation, in Formula 1, X may be or may include, e.g., a substituted or unsubstituted phenyl group or a substituted or unsubstituted naphthyl group. For example, X may be an unsubstituted phenyl group or an unsubstituted naphthyl group.

In an implementation, in the case where X is a naphthyl group, X may be represented by the following structure (e.g., may be bound in Formula 1 at a specific location on the naphthyl group).

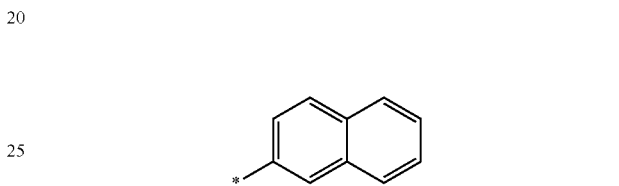

The amine compound represented by Formula 1 may be used as a material for an organic electroluminescence device. For example, the amine compound represented by Formula 1 may be used as a hole transport material.

In an implementation, the amine compound represented by Formula 1 may be, e.g., one of the following Compounds 1-40.

1

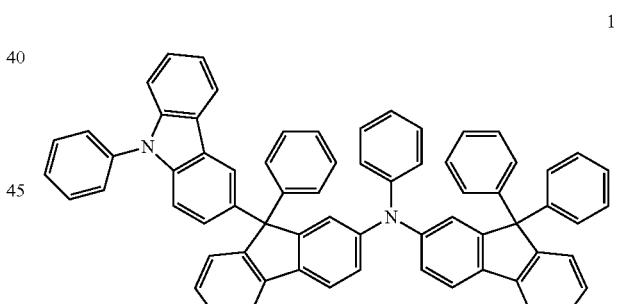

2

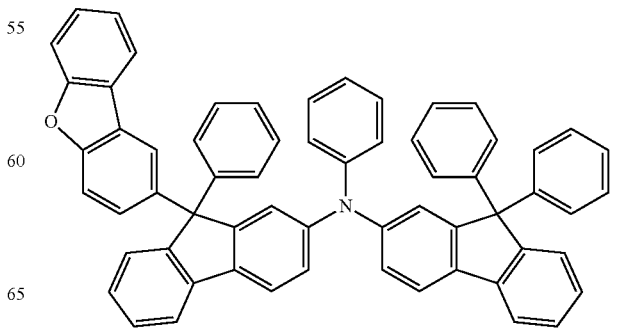

3
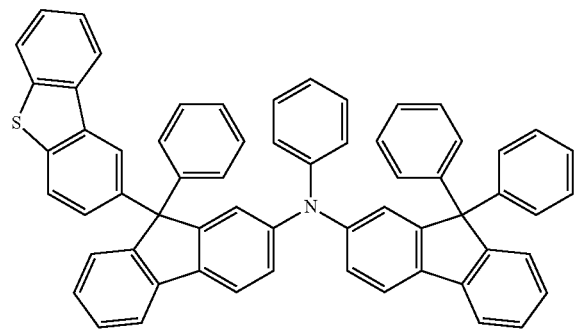
4
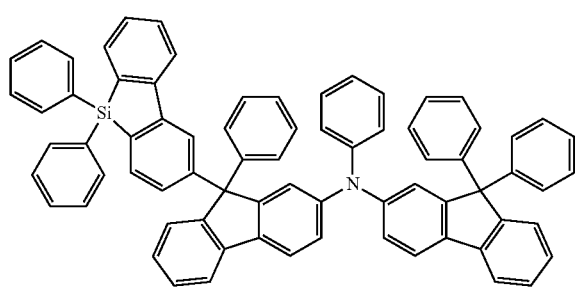
5
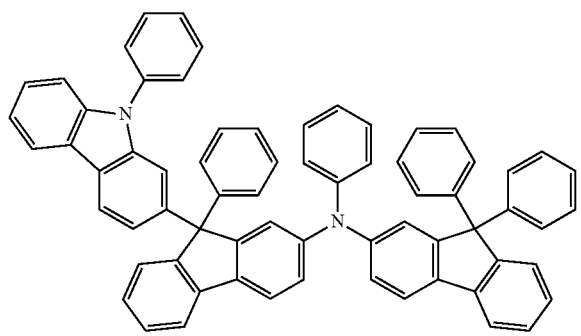
6
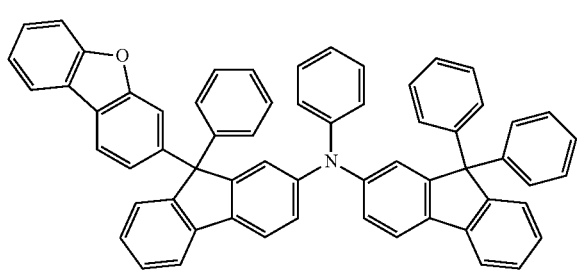
7
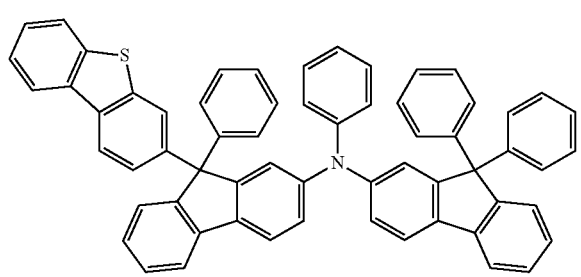
8
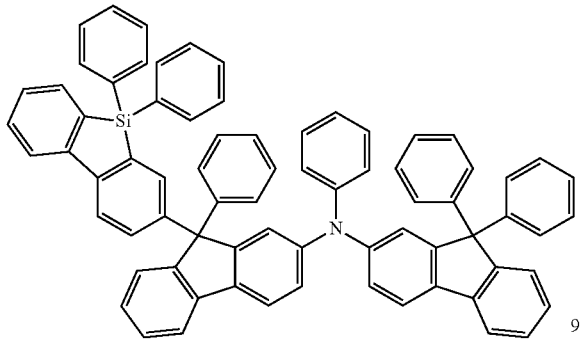
9
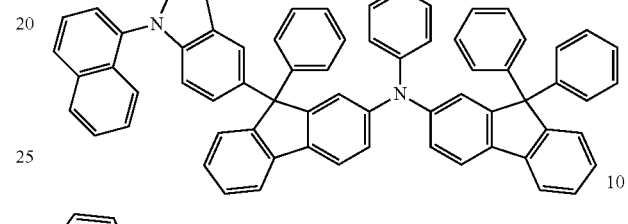
10
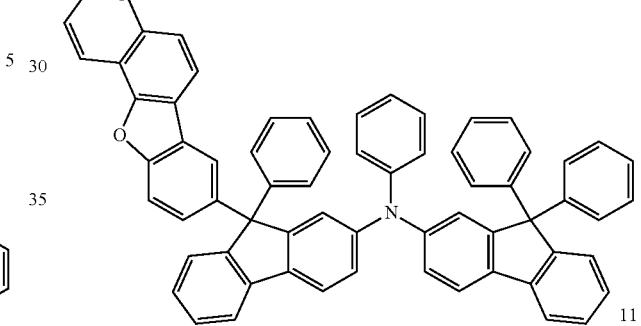
11
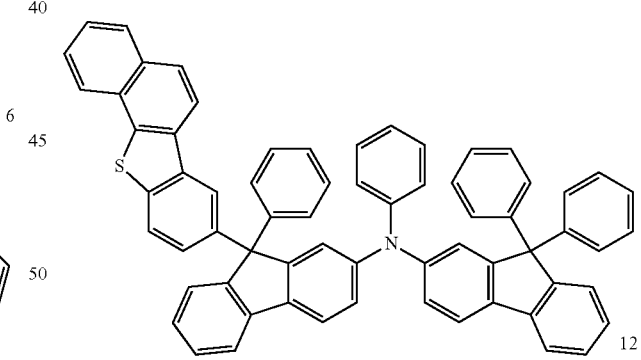
12
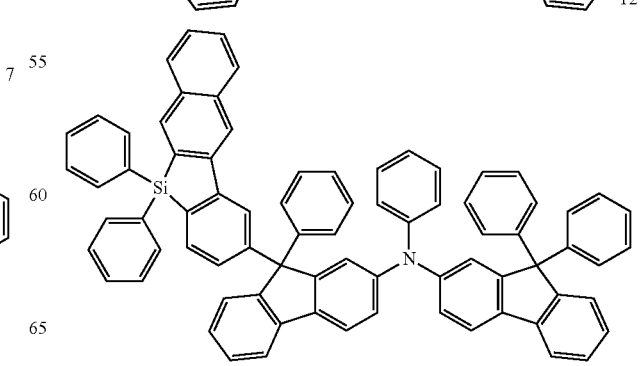

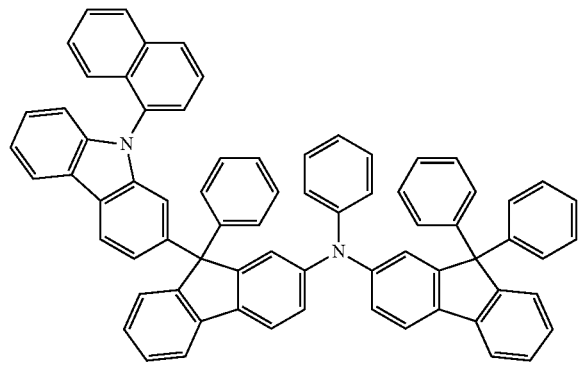
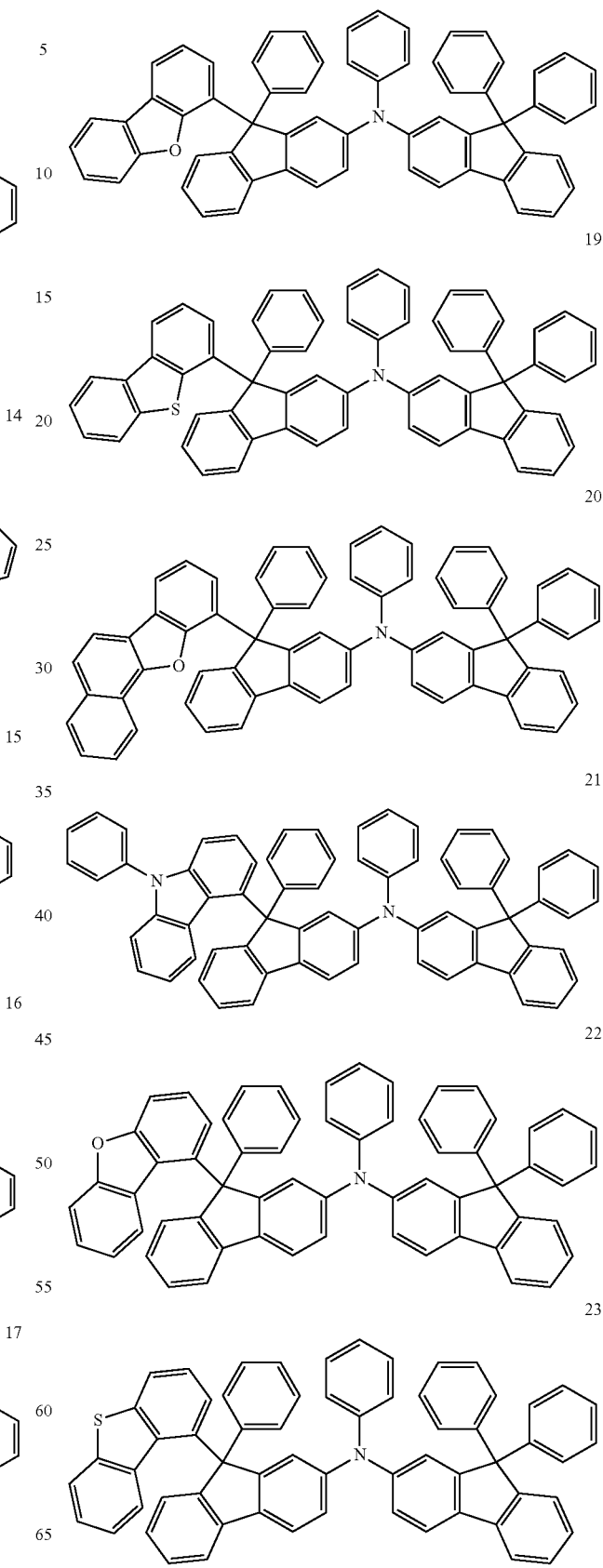

24
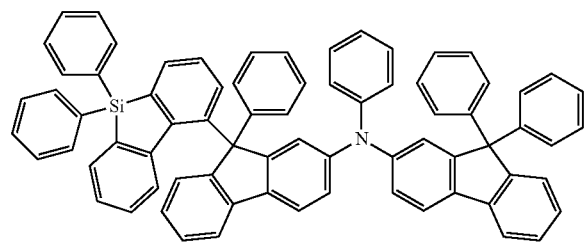
25
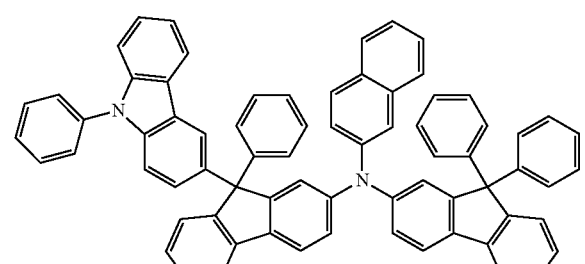
26
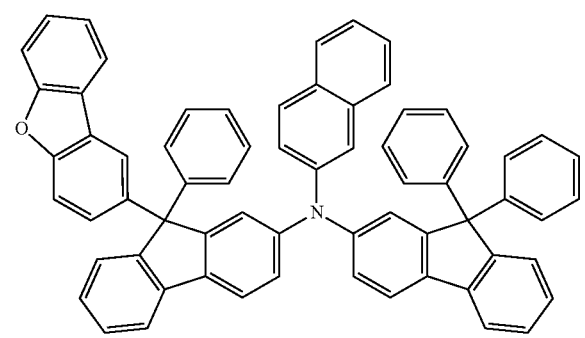
27
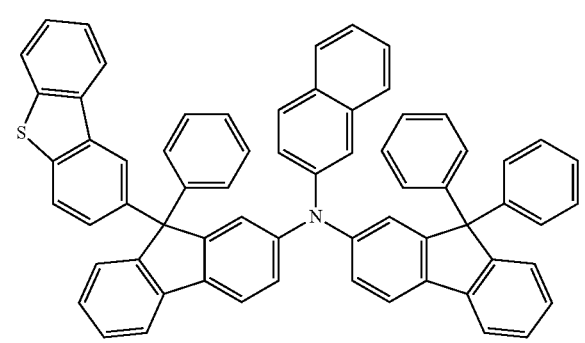
28
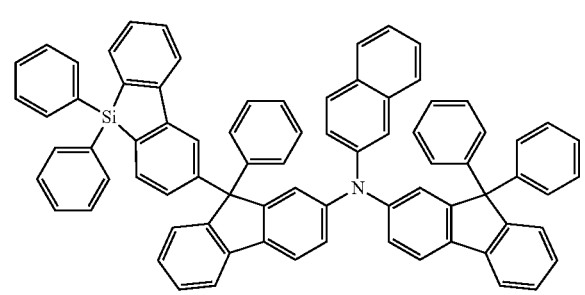
29
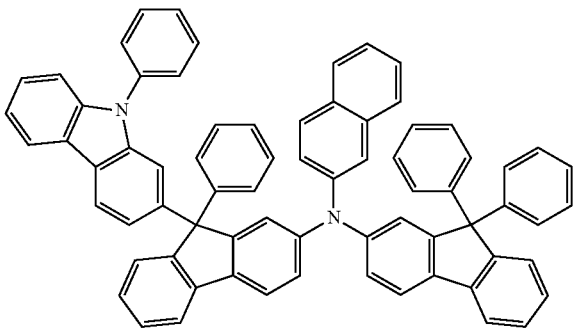
30
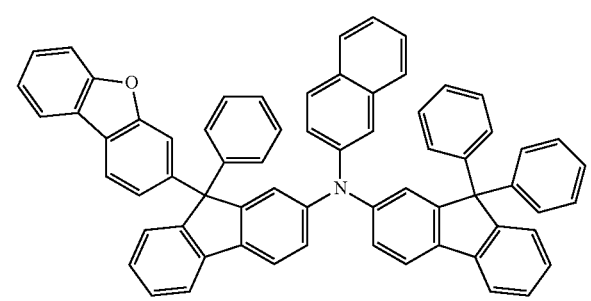
31
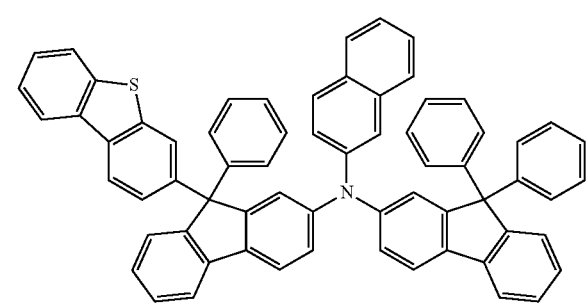
32
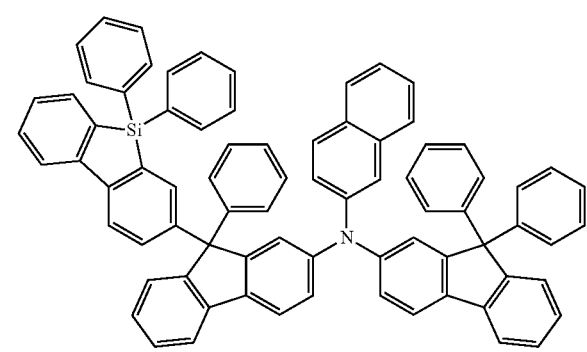

-continued

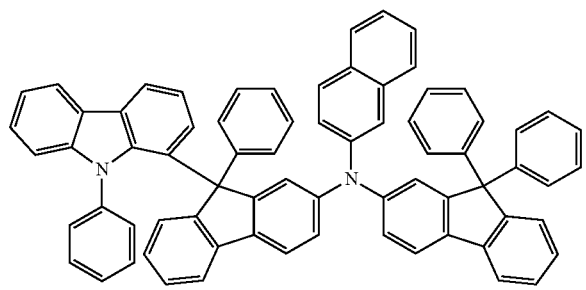
33

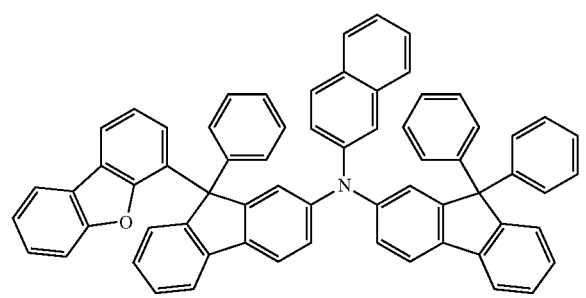
34

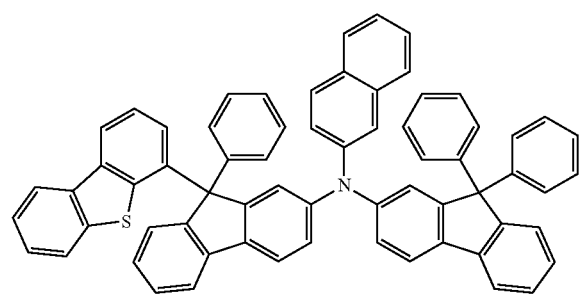
35

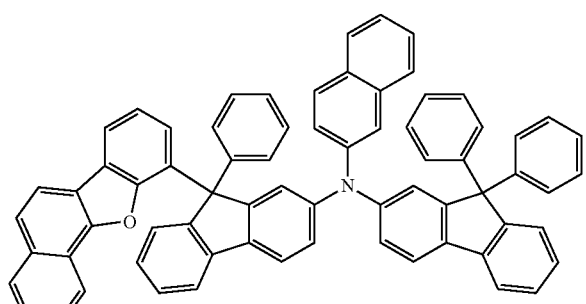
36

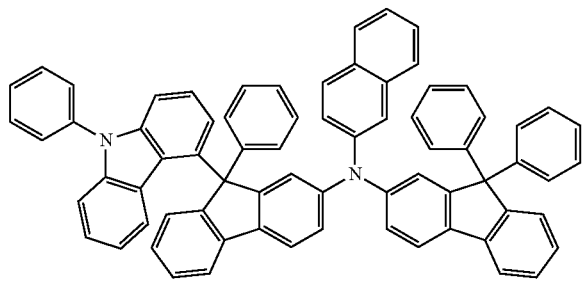
37

-continued

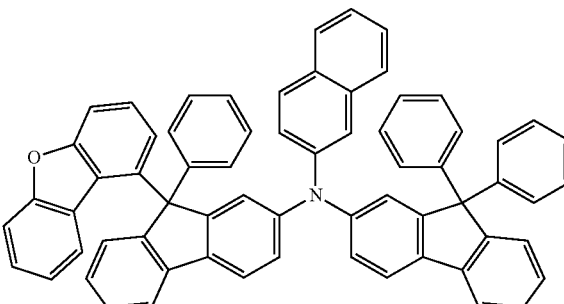
38

39

40

When the amine compound according to an embodiment of the present disclosure is used in an organic electroluminescence device, high efficiency, long life and/or a low driving voltage may be accomplished or achieved.

Hereinafter, an organic electroluminescence device according to an embodiment will be explained. The explanation will be mainly given with difference features from the amine compound according to an embodiment of the present disclosure, and unexplained part will follow the above-description on the amine compound according to an embodiment of the present disclosure.

An organic electroluminescence device according to an embodiment of the present disclosure may include the amine compound according to an embodiment of the present disclosure.

Figure 2:
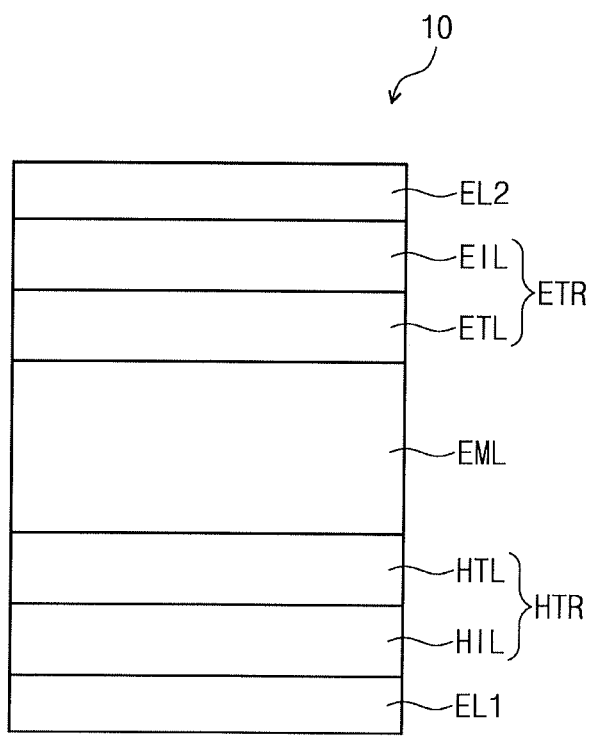
FIG. 2 illustrates a schematic cross-sectional view of an organic electroluminescence device according to an embodiment of the present disclosure.

FIG. 1 illustrates a schematic cross-sectional view of an organic electroluminescence device according to an embodiment of the present disclosure. FIG. 2 illustrates a schematic cross-sectional view of an organic electroluminescence device according to an embodiment of the present disclosure.

Referring to FIGS. 1 and 2, an organic electroluminescence device 10 according to an embodiment of the present disclosure may include a first electrode EL1, a hole transport region HTR, an emission layer EML, an electron transport region ETR, and a second electrode EL2.

The first electrode EL1 may have conductivity. The first electrode EL1 may be a pixel electrode or an anode. The first electrode EL1 may be a transmissive electrode, a transflective electrode, or a reflective electrode. In the case where the first electrode EL1 is the transmissive electrode, the first electrode EL1 may be formed using a transparent metal oxide. e.g., indium tin oxide (ITO), indium zinc oxide (IZO), zinc oxide (ZnO), or indium tin zinc oxide (ITZO). In the case where the first electrode EL1 is the transflective electrode or reflective electrode, the first electrode EL1 may include, e.g., Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). In an implementation, the first electrode EL1 may include a plurality of layers including a reflective layer or transflective layer formed using the above materials, and a transparent conductive layer formed using ITO, IZO, ZnO, or ITZO.

The hole transport region HTR may be provided on the first electrode EL1. The hole transport region HTR may include at least one of a hole injection layer HIL, a hole transport layer HTL, a hole buffer layer, or an electron blocking layer. The thickness of the hole transport region HTR may be, e.g., from about 1,000 Å to about 1,500 Å.

Hereinafter, an embodiment on the inclusion of the amine compound according to an embodiment of the present disclosure in a hole transport region HTR will be explained. In an implementation, the amine compound according to an embodiment of the present disclosure may be included in at least one organic layer between a first electrode EL1 and a second electrode EL2. In an implementation, the amine compound according to an embodiment of the present disclosure may be included in an emission layer EML.

The hole transport region HTR may include the amine compound according to an embodiment of the present disclosure. In an implementation, the hole transport region HTR includes a amine compound represented by the following Formula 1.

[Formula 1]

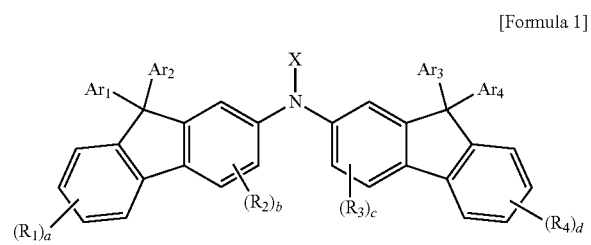

Particular explanation on X, $Ar_1$ to $Ar_4$, $R_1$ to $R_4$, and "a" to "d" is the same as that described above and will be omitted.

The hole transport region HTR may have a single layer formed using a single material, a single layer formed using a plurality of different materials, or a multilayer structure including a plurality of layers formed using a plurality of different materials.

For example, the hole transport region HTR may have a single layer structure of a hole injection layer HIL or a hole transport layer HTL, or may have a single layer structure formed using a hole injection material and a hole transport material. In an implementation, the hole transport region HTR may have a single layer structure formed using a plurality of different materials, or a laminated structure from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer.

In an implementation, in the case where the hole transport region HTR includes the structure of a hole injection layer HIL/hole transport layer HTL, the amine compound according to an embodiment of the present disclosure may be included in the hole transport layer HTL. In an implementation, in the case where the hole transport region HTR has a multilayer structure, the amine compound according to an embodiment of the present disclosure may be included in a layer in contact with an emission layer, or each of a layer in contact with an emission layer and the hole transport layer HTR, respectively. In an implementation, in the case where the hole transport layer HTL includes the amine compound according to an embodiment of the present disclosure, the hole transport layer HTL may include one or two or more kinds of the amine compound according to example embodiments of the present disclosure.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, e.g., a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris {N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyether ketone (TPAPEK). 4-isopropyl-4'-methyldiphenyliodonium tetrakis(pentafluorophenyl)borate, dipyrazino[2,3-f:2',3'-h]quinoxaline-2,3,6,7,10,11-hexacarbonitrile (HAT-CN), etc.

In an implementation, in the case where the hole transport layer HTL includes the amine compound according to an embodiment of the present disclosure, suitable materials may be further included in addition to the amine compound according to an embodiment. For example, carbazole-based derivatives such as N-phenyl carbazole, and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), etc. may be further included.

The thickness of the hole transport region HTR may be from about 100 Å to about 10,000 Å, e.g., from about 100 Å to about 1,000 Å. In an implementation, in the case where the hole transport region HTR includes both the hole injection layer HIL and the hole transport layer HTL, the thickness of the hole injection layer HIL may be from about 100 Å to about 10,000 Å, e.g., from about 100 Å to about 1.000 Å, and the thickness of the hole transport layer HTL may be from about 30 Å to about 1,000 Å. In an implementation, in the case where the thicknesses of the hole transport region HTR, the hole injection layer HIL, and the hole transport layer HTL satisfy the above-described ranges, satisfactory hole transport properties may be obtained without the substantial increase of a driving voltage.

The hole transport region HTR may further include a charge generating material in addition to the above-described materials to improve conductivity. The charge generating material may be dispersed in the hole transport region HTR uniformly or non-uniformly. The charge generating material may be, e.g., a p-dopant. The p-dopant may be, e.g., one of quinone derivatives, metal oxides, or cyano group-containing compounds. Examples of the p-dopant may include quinone derivatives such as tetracyanoquinodimethane (TCNQ), and 2,3,5,6-tetrafluoro-tetracyanoquinodimethane (F4-TCNQ), metal oxides such as tungsten oxide, and molybdenum oxide.

As described above, the hole transport region HTR may further include at least one of a hole buffer layer or an electron blocking layer in addition to the hole injection layer HIL and the hole transport layer HTL. The hole buffer layer may compensate an optical resonance distance according to the wavelength of light emitted from the emission layer EML and increase light emission efficiency. Materials included in the hole transport region HTR may be used as a material included in the hole buffer layer. The electron blocking layer is a layer preventing electron injection from the electron transport region ETR into the hole transport region HTR.

The emission layer EML may be provided on the hole transport region HTR. The emission layer 150 is a layer emitting light via fluorescence or phosphorescence and may be formed to a thickness of, e.g., from about 100 Å to about 600 Å.

The emission layer EML may have a single layer formed using a single material, a single layer formed using a plurality of different materials, or a multilayer structure having a plurality of layers formed using a plurality of different materials.

As the material for an emission layer EML, suitable luminescent materials may be used, e.g., fluoranthene derivatives, pyrene derivatives, arylacetylene derivatives, fluorene derivatives, perylene derivatives, chrysene derivatives, etc., may be used. In an implementation, the pyrene derivatives, the perylene derivatives, the anthracene derivatives may be used. For example, as the host material of the emission layer EML, anthracene derivatives represented by the following Formula 5 may be used.

[Formula 5]

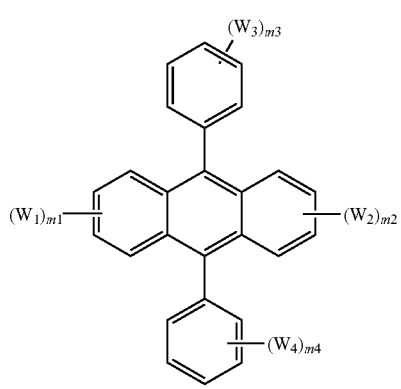

In Formula 5, $W_1$ to $W_4$ may each independently be or include, e.g., a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, m1 and m2 may each independently be an integer of 0 to 4, and m3 and m4 may each independently be an integer of 0 to 5. In Formula 5. $Z_3$ and $Z_4$ may each independently be combined with an adjacent group to form a saturated or unsaturated ring.

In the case where m1 is 2 or more, a plurality of W1 are the same or different. In the case where m2 is 2 or more, a plurality of W2 are the same or different. In the case where m3 is 2 or more, a plurality of W3 are the same or different. In the case where m4 is 2 or more, a plurality of W4 are the same or different.

In an implementation, the compound represented by Formula 5 may be, e.g., a compound represented by the following structures.

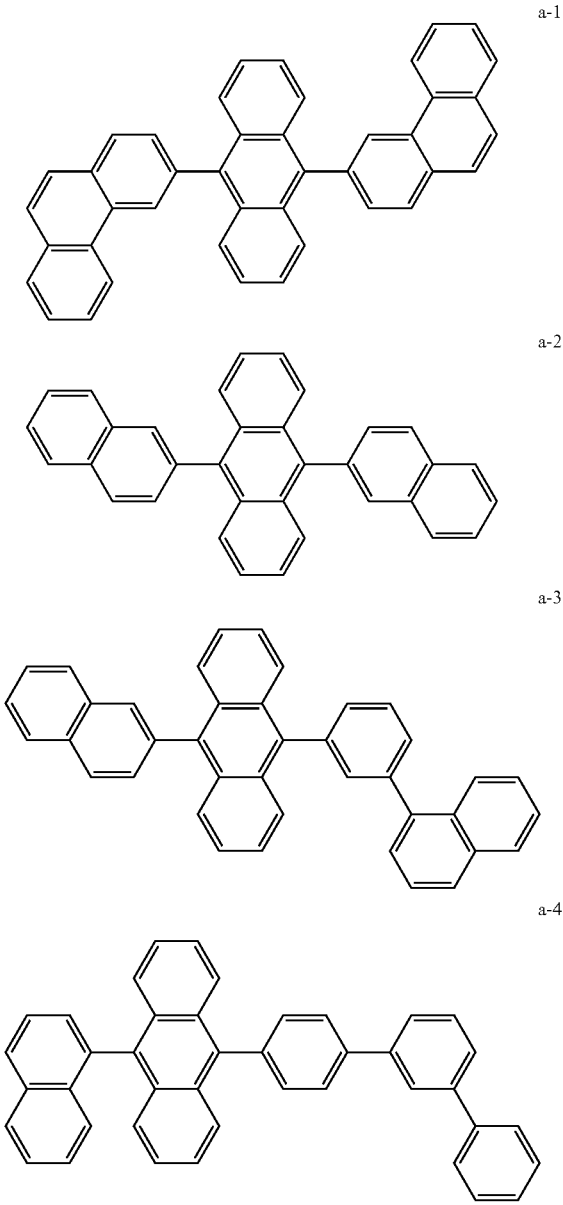

a-5
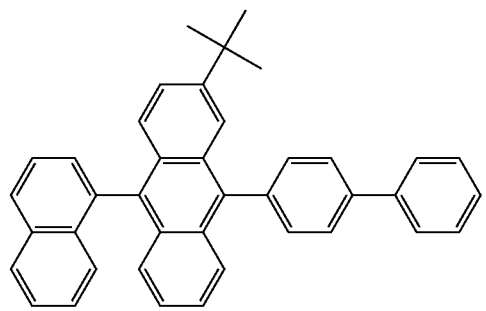

a-6
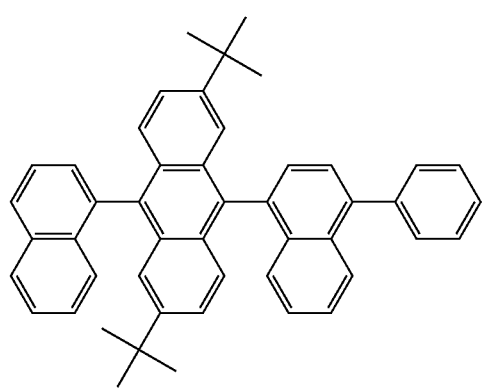

a-7
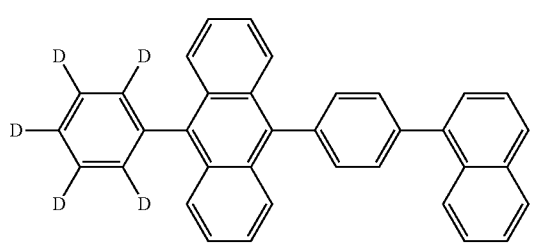

a-8
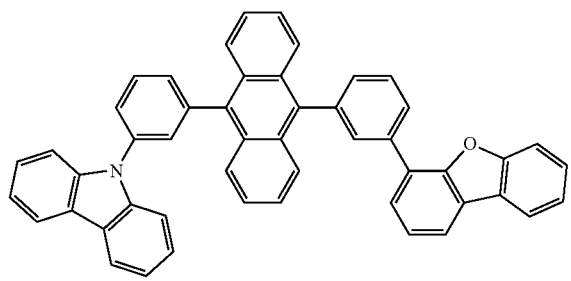

a-9
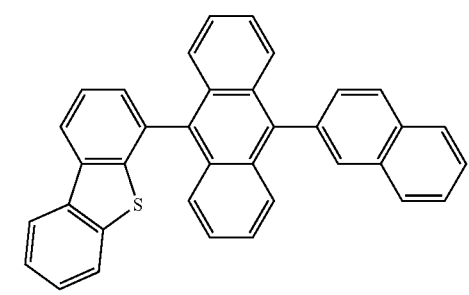

a-10
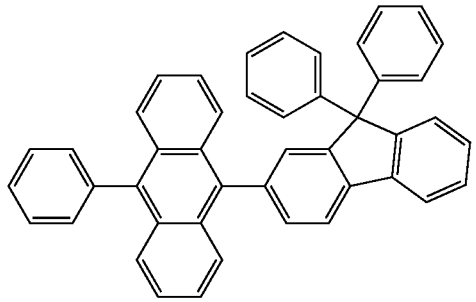

a-11
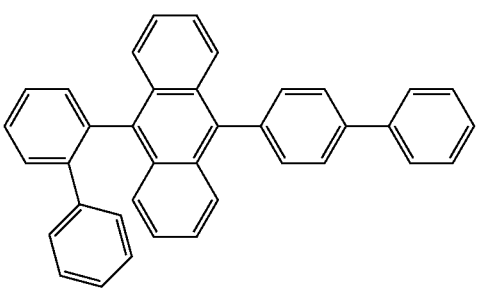

a-12
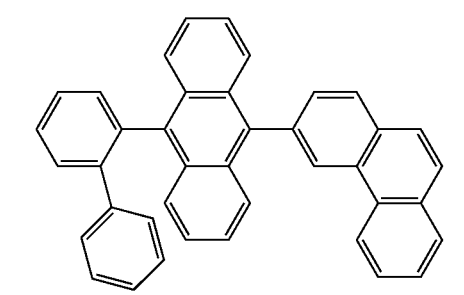

In an implementation, the emission layer EML may include a fluorescent material including, e.g., one selected from the group of spiro-DPVBi, spiro-6P, 2,2',7,7'-tetrakis(biphenyl-4-yl)-9,9'-spirobifluorene (spiro-sexiphenyl), distyryl-benzene (DSB), distyryl-arylene (DSA), a polyfluorene (PFO)-based polymer, and a poly(p-phenylene vinylene)-based polymer (PPV).

The emission layer EML may further include a dopant, and the dopant may use suitable materials. For example, styryl derivatives such as 1,4-bis[2-(3-N-ethylcarbazoryl)vinyl]benzene (BCzVB), 4-(di-p-tolylamino)-4"-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi), perylene and the derivatives thereof such as 2,5,8,11-tetra-t-butylperylene (TBPe), pyrene and the derivatives thereof such as 1,1-dipyrene, 1,4-dipyrenylbenzene, 1,4-bis(N,N-diphenylamino)pyrene), 2,5,8,11-tetra-t-butylperylene (TBP), and 1,3,5-tris(N-phenylbenzimidazole-2-yl)benzene (TPBi) may be used as the dopant.

The emission layer EML may include, e.g., tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP 1), 1,4-bis (triphenylsilyl)benzene (UGH2), hexaphenylcyclotrisiloxane (DPSiO$_3$), octaphenylcyclotetra siloxane (DPSiO$_4$), 2,8-bis(diphenylphosphoryl)dibenzofuran (PPF), etc.

The electron transport region ETR may be provided on the emission layer EML. In an implementation, the electron transport region ETR may include, e.g., at least one of an electron blocking layer, an electron transport layer ETL, or an electron injection layer EIL.

The electron transport region ETR may have a single layer formed using a single material, a single layer formed using a plurality of different materials, or a multilayer structure including a plurality of layers formed using a plurality of different materials.

In an implementation, the electron transport region ETR may have a single layer structure of the electron injection layer EIL or the electron transport layer ETL, or a single layer structure formed using an electron injection material and an electron transport material. In addition, the electron transport region ETR may have a single layer structure formed using a plurality of different materials, or a laminated structure from the first electrode EL1 of electron transport layer ETL/electron injection layer EIL, or hole blocking layer/electron transport layer ETL/electron injection layer EIL. The thickness of the electron transport region ETR may be, e.g., from about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

In an implementation, in the case where the electron transport region ETR includes the electron transport layer ETL, the electron transport region ETR may include, e.g., tris(8-hydroxyquinolinato)aluminum (Alq$_3$), 1,3,5-tri[(3-pyridyl)-phen-3-yl]benzene. 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq$_2$), 9,10-di(naphthalene-2-yl)anthracene (ADN), or a mixture thereof. The thickness of the electron transport layer ETL may be from about 100 Å to about 1,000 Å, e.g., from about 150 Å to about 500 Å. If the thickness of the electron transport layer ETL satisfies the above-described range, satisfactory electron transport properties may be obtained without the substantial increase of a driving voltage.

In an implementation, in the case where the electron transport region ETR includes the electron injection layer EIL, the electron transport region ETR may include, e.g., LiF, lithium quinolate (LiQ), Li$_2$O, BaO, NaCl, CsF, a metal in lanthanoides such as Yb, or a metal halide such as RbCL and RbI. The electron injection layer EIL also may be formed using a mixture material of an electron transport material and an insulating organo metal salt. The organo metal salt may be a material having an energy band gap of about 4 eV or more. In an implementation, the organo metal salt may include. e.g., metal acetates, metal benzoates, metal acetoacetates, metal acetylacetonates, or metal stearates.

The thickness of the electron injection layer EIL may be from about 1 Å to about 100 Å, e.g., from about 3 Å to about 90 Å. In the case where the thickness of the electron injection layer EIL satisfies the above described range, satisfactory electron injection properties may be obtained without inducing substantial increase of a driving voltage.

The electron transport region ETR may include a hole blocking layer as described above. In an implementation, the hole blocking layer may include, e.g., at least one of 2,9-dimethyl-4,7-diphenyl-1,10-phenanthroline (BCP), or 4,7-diphenyl-1,10-phenanthroline (Bphen).

The second electrode EL2 may be provided on the electron transport region ETR. The second electrode EL2 may be a common electrode or a cathode. The second electrode EL2 may be a transmissive electrode, a transflective electrode, or a reflective electrode. In the case where the second electrode EL2 is the transmissive electrode, the second electrode EL2 may include transparent metal oxides, e.g., ITO, IZO, ZnO, ITZO, etc.

In the case where the second electrode EL2 is the transflective electrode or reflective electrode, the second electrode EL2 may include, e.g., Ag, Mg, Cu, Al, Pt, Pd, Au, Ni, Nd, Ir, Cr, Li, Ca, LiF/Ca, LiF/Al, Mo, Ti, a compound including thereof, or a mixture thereof (for example, a mixture of Ag and Mg). Also, the second electrode EL2 may have a multilayered structure including a reflective layer or a transflective layer formed using the above-described materials, and a transparent conductive layer formed using ITO, IZO, ZnO, ITZO, etc.

In an implementation, the second electrode EL2 may be connected with an auxiliary electrode. The auxiliary electrode may be connected with the second electrode EL2 to decrease the resistance of the second electrode EL2.

In the organic electroluminescence device 10, a voltage may be applied to each of the first electrode EL1 and the second electrode EL2, and holes injected from the first electrode EL1 move via the hole transport region HTR to the emission layer EML, and electrons injected from the second electrode EL2 move via the electron transport region ETR to the emission layer EML. The electrons and holes are recombined in the emission layer EML to generate excitons, which may emit light via transition from an excited state to a ground state.

In the case where the organic electroluminescence device 10 is a top emission type, the first electrode EL1 may be a reflective electrode, and the second electrode EL2 may be a transmissive electrode or a transflective electrode. In the case where the organic electroluminescence device 10 is a bottom emission type, the first electrode EL1 may be a transmissive electrode or a transflective electrode, and the second electrode EL2 may be a reflective electrode.

The organic electroluminescence device according to an embodiment of the present disclosure may include a amine compound represented by Formula 1 in a hole transport region, thereby attaining high efficiency, long life and/or a low driving voltage.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHETIC EXAMPLES

A amine compound according to an embodiment of the present disclosure may be synthesized, for example, as follows.

1. Synthesis of Compound 1

Compound 1 which is a amine compound according to an embodiment of the present disclosure may be synthesized, for example, by the following reaction.

(Synthesis of Compound A)

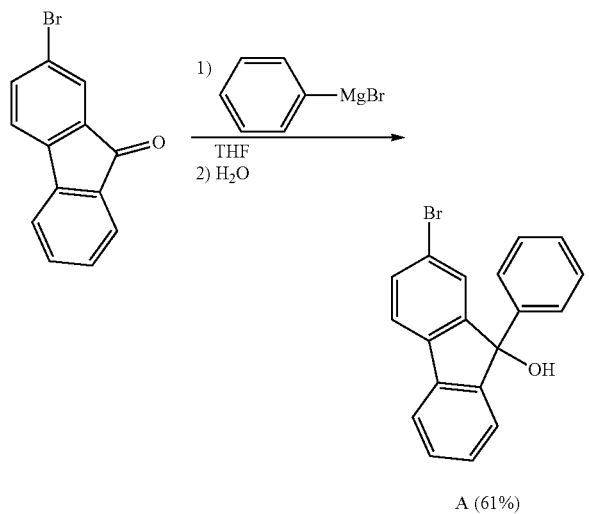

A (61%)

Under an argon (Ar) atmosphere, 15 ml of a THF solution in which 1.8 g of 2-bromofluorenone was dissolved was injected into a 50 ml, three-necked flask, and 10 ml of phenylmagnesium bromide (1.0 M solution in THF) was added dropwise thereto for 15 minutes and heated at 80° C. for 5 hours. After air cooling, an aqueous ammonium chloride (NH₄Cl) solution and dichloromethane were added thereto, an organic layer was separated, and solvents were distilled. The crude product thus obtained was separated by silica gel column chromatography (using hexane/ethyl acetate) to obtain 1.85 g (yield 79%) of Compound A as a yellow solid.

The molecular weight of Compound A measured by FAB-MS was 337.

(Synthesis of Compound B)

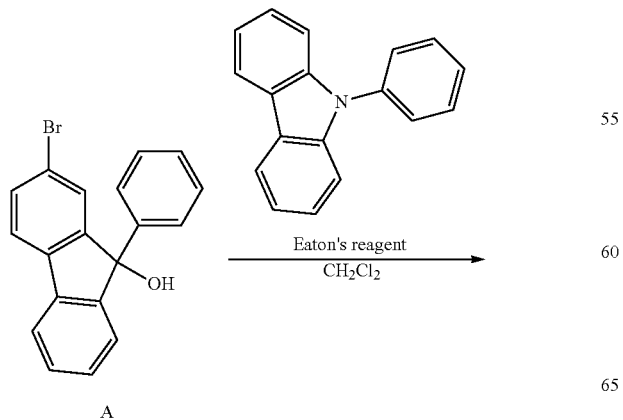

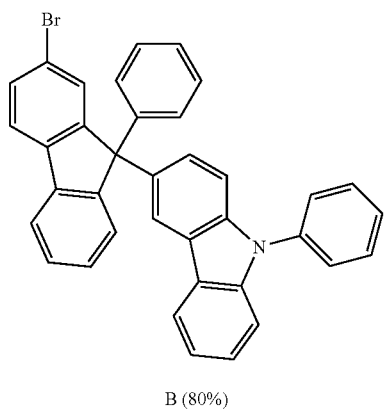

B (80%)

In a 200 ml, three-necked flask, 5.00 g of Compound A and 5.20 g of 9-phenylcarbazole were dissolved in 300 ml of anhydrous CH₂Cl₂ solution, and 1.3 ml of Eaton's reagent (7.7 wt % P₂O₅ in CH₃SO₃H) was added dropwise thereto for 5 minutes at ambient temperature, followed by heating at 100° C. for 6 hours. After air cooling, distilled water was added, an organic layer was separated, and solvents were distilled. The crude product thus obtained was separated by silica gel column chromatography (using hexane/toluene) to obtain 7.00 g (yield 85%) of Compound B as a pale yellow solid.

The molecular weight of Compound B measured by FAB-MS was 563.

(Synthesis of Compound 1)

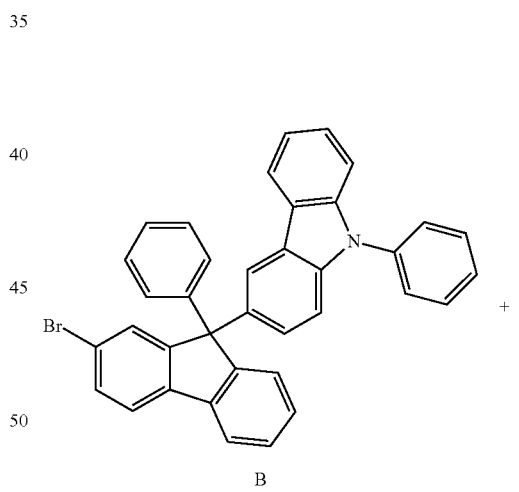

B

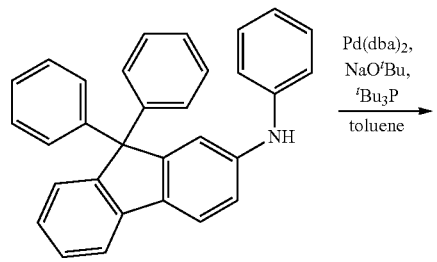

-continued

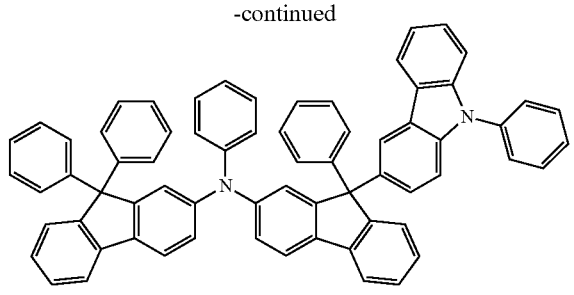

1 (91%)

Under an argon atmosphere, 10.6 g of Compound B, 8.20 g of N,9,9-triphenyl-9H-fluoren-2-amine, 20.540 g of Pd(dba)$_2$, 4.51 g of NaOtBu, and 0.18 g of tBu$_3$P were added to a 300 ml, three-necked flask, and heated and refluxed in a solvent of 110 ml of toluene for 6 hours. After air cooling, water was added, an organic layer was separated, and solvents were distilled. The crude product was separated by silica gel chromatography (using hexane/toluene) to obtain 14.5 g (yield 91%) of Compound 1 as a pale yellow solid.

The molecular weight of Compound 1 measured by FAB-MS was 891. In addition, the chemical shift (δ) values of Compound 1 measured by $^1$H-NMR (CDCl$_3$) were 8.45 (dd, 4H, J=7.10 Hz), 8.41 (d, 1H, J=7.82 Hz), 8.25 (dd, 4H, J=7.20 Hz), 8.10 (d, 2H, J=7.80 Hz), 8.02-7.89 (m, 8H), 7.69-7.62 (m, 8H), 7.48-7.43 (m, 3H), 7.41-7.25 (m, 10H), 7.18-7.02 (m, 6H).

2. Synthesis of Compound 2

Compound 2 was synthesized by the same method described for synthesizing Compound 1 except for using dibenzofuran instead of 9-phenylcarbazole. The molecular weight of Compound 2 measured by FAB-MS was 816. In addition, the chemical shift (δ) values of Compound 2 measured by $^1$H-NMR (CDCl$_3$) were 8.45 (dd, 4H, J=7.10 Hz), 8.25 (dd, 4H, J=7.20 Hz), 8.14 (d, 2H, J=7.80 Hz), 8.04-7.95 (m, 4H), 7.79-7.68 (m, 8H), 7.45-7.40 (m, 3H), 7.36-7.25 (m, 10H), 7.18-7.07 (m, 6H).

3. Synthesis of Compound 3

Compound 3 was synthesized by the same method described for synthesizing Compound 1 except for using dibenzothiophene instead of 9-phenylcarbazole. The molecular weight of Compound 3 measured by FAB-MS was 832. In addition, the chemical shift (δ) values of Compound 3 measured by $^1$H-NMR (CDCl$_3$) were 8.44 (dd, 4H, J=7.90 Hz), 8.25 (dd, 4H, J=7.20 Hz), 8.20 (d, 2H, J=7.80 Hz), 8.04-7.95 (m, 4H), 7.81-7.72 (m, 8H), 7.45-7.40 (m, 3H), 7.36-7.25 (m, 10H), 7.13-7.09 (m, 6H).

4. Synthesis of Compound 18

Compound 18 was synthesized by the same method described for synthesizing Compound 1 except for using 4-dibenzofuranyllithium instead of phenylmagnesium bromide and using benzene instead of 9-phenylcarbazole. The molecular weight of Compound 18 measured by FAB-MS was 816. In addition, the chemical shift (δ) values of Compound 18 measured by $^1$H-NMR (CDCl$_3$) were 8.40 (dd, 4H, J=7.30 Hz), 8.28 (dd, 4H, J=7.20 Hz), 8.14 (d, 2H, J=7.80 Hz), 8.06-7.95 (m, 6H), 7.75-7.68 (m, 6H), 7.45-7.40 (m, 3H), 7.36-7.25 (m, 10H), 7.13-7.02 (m, 6H).

The molecular weight of the compounds was measured by FAB-MS using JMS-700V manufactured by JEOL Co. In addition, the NMR of the compounds was measured by $^1$H-NMR using AVAVCE300M manufactured by Bruker Biospin K.K. Co.

(Device Manufacturing Examples)

Organic electroluminescence devices according to Examples 1 to 4 were manufactured using Compounds 1, 2, 3, and 18 as hole transport materials.

Example Compounds

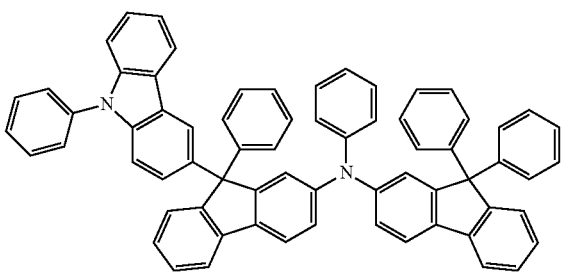

1

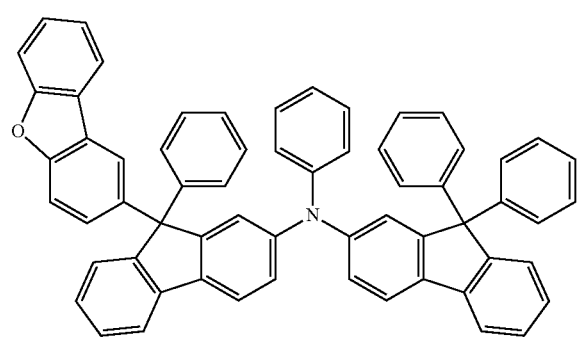

2

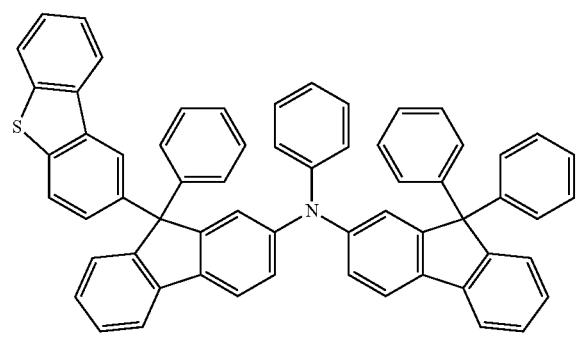

3

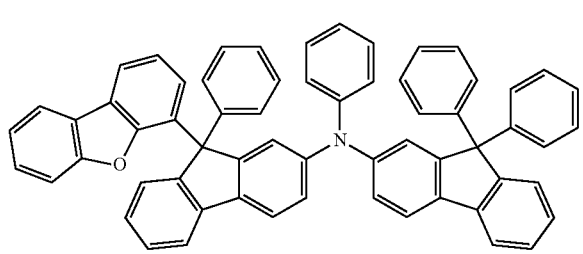

18

Organic electroluminescence devices according to Comparative Examples 1 to 5 were manufactured using Comparative Compounds A-1 to A-5 as hole transport materials.

[Comparative Compounds]

A-1
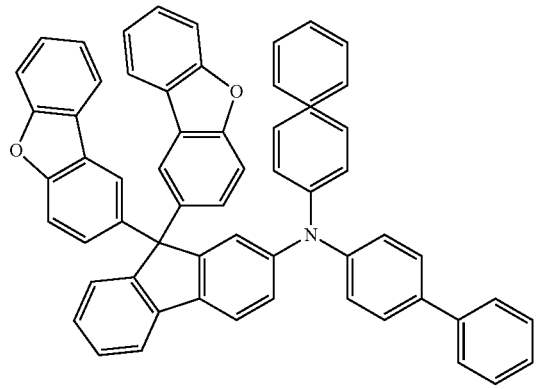

A-4
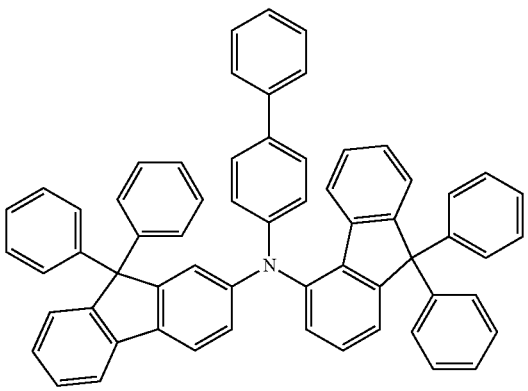

A-2
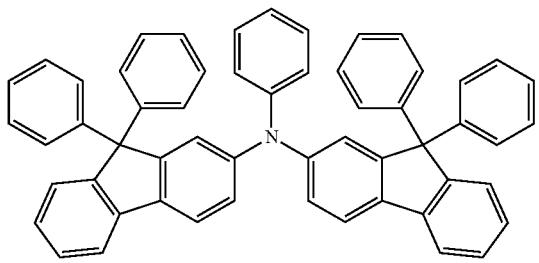

A-5
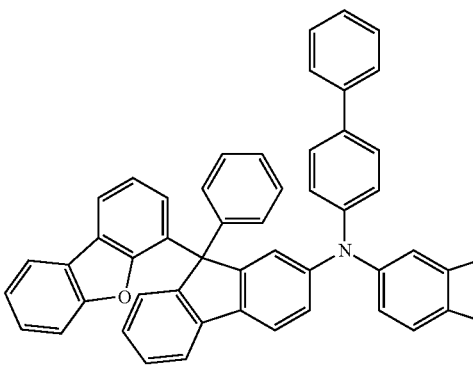

A-3
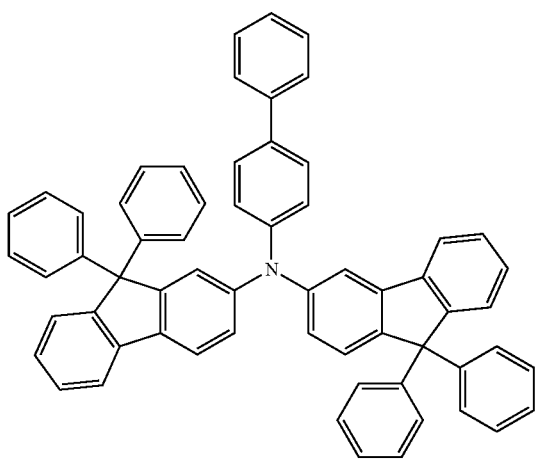

Organic electroluminescence devices according to Examples 1 to 4 and Comparative Examples 1 to 5 were manufactured by forming a first electrode using ITO to a thickness of about 150 nm, a hole injection layer using TNATA to a thickness of about 60 nm, a hole transport layer using the compound according to the Examples or the Comparative Examples to a thickness of about 30 nm, an emission layer using 9,10-di(naphthalene-2-yl)anthracene (ADN) doped with 3% 2,5,8,11-tetra-t-butylperylene (TBP) to a thickness of about 25 nm, an electron transport layer using $Alq_3$ to a thickness of about 25 nm, an electron injection layer using LiF to a thickness of about 1 nm, and a second electrode using Al to a thickness of about 100 nm. Each layer was formed by a vacuum deposition method.

Then, the voltage, emission efficiency, and life of the organic electroluminescence devices thus manufactured were measured. Evaluation results are listed in Table 1 below.

TABLE 1

| Device manufacturing example | Hole transport layer material | Current density (mA/cm$^2$) | Voltage (V) | Emission efficiency (cd/A) | Life LT50 (h) |
|---|---|---|---|---|---|
| Example 1 | Example Compound 1 | 10 | 5.6 | 6.8 | 1,800 |
| Example 2 | Example Compound 2 | 10 | 5.6 | 6.6 | 1,900 |
| Example 3 | Example Compound 3 | 10 | 5.4 | 6.5 | 1,850 |
| Example 4 | Example Compound 18 | 10 | 5.4 | 6.5 | 1,850 |
| Comparative Example 1 | Comparative Compound A-1 | 10 | 6.2 | 5.2 | 1,500 |
| Comparative Example 2 | Comparative Compound A-2 | 10 | 6.5 | 5.1 | 1,510 |
| Comparative Example 3 | Comparative Compound A-3 | 10 | 6.2 | 5.2 | 1,500 |
| Comparative Example 4 | Comparative Compound A-4 | 10 | 6.4 | 5.3 | 1,520 |
| Comparative Example 5 | Comparative Compound A-5 | 10 | 6.4 | 5.3 | 1,500 |

Half life (Life LT50) means time taken for reducing initial luminance of 1,000 cd/m$^2$ to the half thereof.

The current density, voltage, and emission efficiency of the devices were respectively measured using Source Meter of 2400 Series manufactured by Keithley Instruments Co. Ltd., a CS-200 Chroma Meter manufactured by Konica Minolta Holdings Co., Ltd., and PC program LabVIEW 8.2 for measurement manufactured by Japanese National Instruments Co., Ltd. in a dark room.

Referring to Table 1, a lower driving voltage, longer life, and higher efficiency were accomplished for Examples 1 to 4, when compared to Comparative Examples 1 to 5.

The amine compound according to an embodiment of the present disclosure may include a dibenzoheterole group with high charge tolerance, and long device life may be attained while maintaining amine properties due to high charge tolerance. The amine compound according to an embodiment of the present disclosure may also include two fluorenyl groups. Two fluorenyl groups with high rigidity may be included in the amine compound, stacking properties between molecules may be improved, hole transport properties may increase, and a low driving voltage and high efficiency may be attained.

In the amine compound of Comparative Example 1, two dibenzofuranyl groups were substituted with one fluorenyl group, steric hindrance is very large, and charge tolerance of molecules were lowered, thereby attaining shorter life, lower emission efficiency and higher driving voltage when compared to those of Examples 1 to 4.

In the amine compounds of Comparative Examples 2 to 4, two fluorenyl groups were included and a dibenzoheterole group was not included, charge tolerance was lower than the example amine compounds, and device life was shorter when compared to that of Examples 1 to 4.

In the amine compound of Comparative Example 5, a 9,9'-dimethylfluorenyl group (which is a methyl substituted fluorenyl group) was included, and heat tolerance was low. Accordingly, the device life of Comparative Example 5 was shorter than that of Examples 1 to 4.

From the results of Table 1, it may be be seen that an organic electroluminescence device including a amine compound according to an embodiment of the present disclosure may attain a low driving voltage, long life and increased efficiency at the same time.

The embodiments may provide a amine compound which is capable of being used as a material for a hole transport material, and an organic electroluminescence device including the same in a hole transport region.

An organic electroluminescence device including a amine compound according to an embodiment of the present disclosure may attain high efficiency.

An organic electroluminescence device including a amine compound according to an embodiment of the present disclosure may have driving voltage decreasing effect.

An organic electroluminescence device including a amine compound according to an embodiment of the present disclosure may attain long life.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

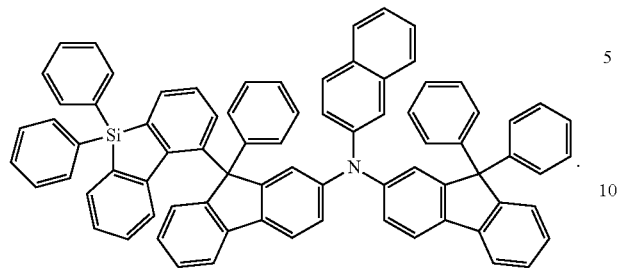

What is claimed is:

1. An amine compound represented by the following Formula 1:

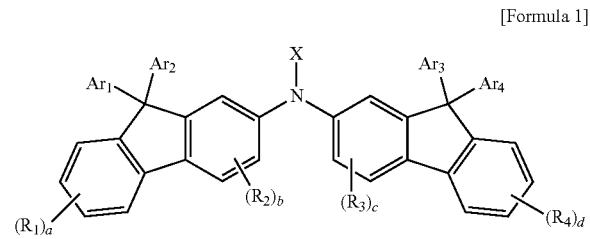

[Formula 1]

wherein in Formula 1, $Ar_1$ to $Ar_4$ are each independently a substituted or unsubstituted aryl group having 6 to 30 ring carbon atoms or a substituted or unsubstituted polycyclic heteroaryl group having 2 to 30 ring carbon atoms, $Ar_1$ to $Ar_4$ are separate or are combined with an adjacent group to form a ring, $R_1$ to $R_4$ are each independently a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_1$ to $R_4$ are separate or are combined with an adjacent group to form a ring, a and d are each independently an integer of 0 to 4, b and c are each independently an integer of 0 to 3, X is a substituted or unsubstituted aryl group having 6 to 30 ring carbon atoms or a substituted or unsubstituted heteroaryl group having 2 to 30 ring carbon atoms, and at least one of $Ar_1$ to $Ar_4$ is a substituted or unsubstituted polycyclic heteroaryl group having 2 to 30 ring carbon atoms.

2. The amine compound as claimed in claim 1, wherein the amine compound represented by Formula 1 is represented by the following Formula 2:

[Formula 2]

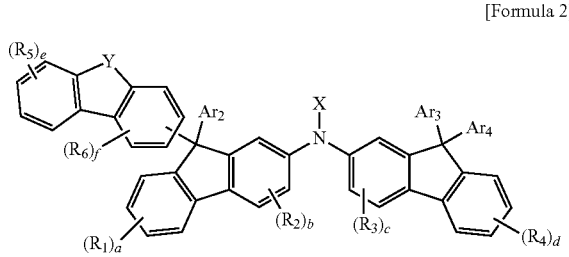

wherein in Formula 2,

Y is O, S, $SiR_7R_8$, or $NR_9$, $R_5$ to $R_9$ are each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_5$ to $R_9$ are separate or are combined with an adjacent group to form a ring, e is an integer of 0 to 4, f is an integer of 0 to 3, and $Ar_1$ to $Ar_4$, $R_1$ to $R_4$, a to d, and X are defined the same as those of Formula 1.

3. The amine compound as claimed in claim 2, wherein the amine compound represented by Formula 2 is represented by the following Formula 2-1:

[Formula 2-1]

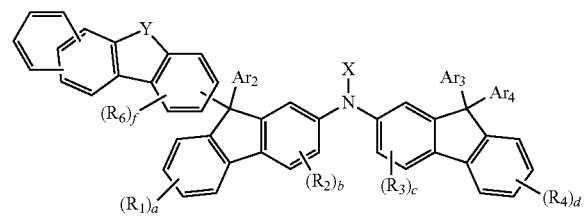

wherein in Formula 2-1, $Ar_2$ to $Ar_4$, $R_1$ to $R_4$, $R_6$, a to d, f, Y, and X are defined the same as those of Formula 2.

4. The amine compound as claimed in claim 2, wherein $Ar_2$ is a substituted or unsubstituted aryl group having 6 to 15 ring carbon atoms.

5. The amine compound as claimed in claim 1, wherein the amine compound represented by Formula 1 is represented by the following Formula 3:

[Formula 3]

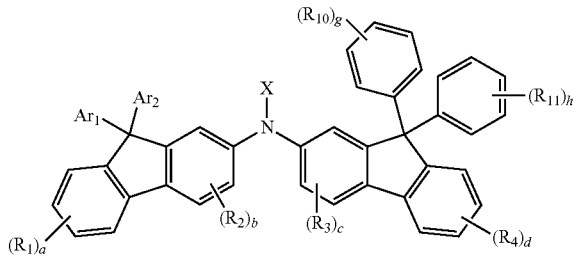

wherein in Formula 3, $R_{10}$ and $R_{11}$ are each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, g and h are each independently an integer of 0 to 5, $Ar_1$, $Ar_2$, X, $R_1$ to $R_4$, and a to d are defined the same as those of Formula 1, and at least one of $Ar_1$ and $Ar_2$ is a substituted or unsubstituted heteroaryl group having 2 to 3 ring carbon atoms.

6. The amine compound as claimed in claim 1, wherein the amine compound represented by Formula 1 is represented by the following Formula 4:

[Formula 4]

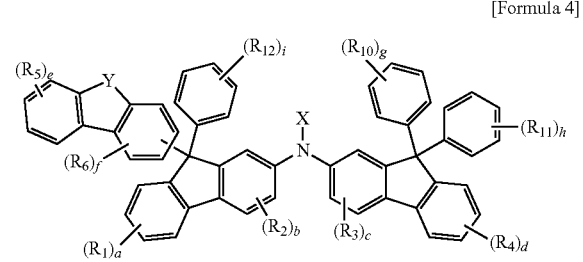

wherein in Formula 4,

Y is O, S, $SiR_7R_8$, or $NR_9$, $R_5$ to $R_{12}$ are each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_5$ to $R_{12}$ are separate or are combined with an adjacent group to form a ring, e is an integer of 0 to 4, f is an integer of 0 to 3, g to i are each independently an integer of 0 to 5, and $R_1$ to $R_4$, a to d, and X are defined the same as those of Formula 1.

7. The amine compound as claimed in claim 1, wherein X is a group represented by one of the following structures:

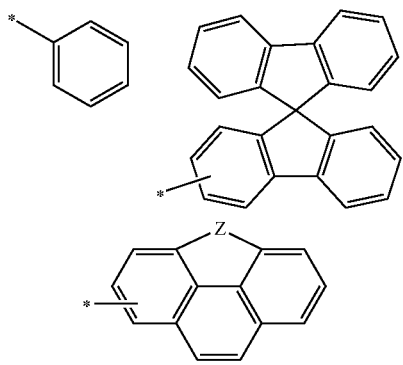

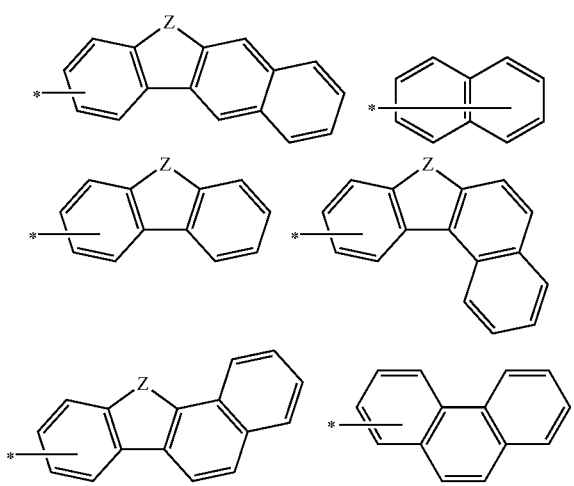

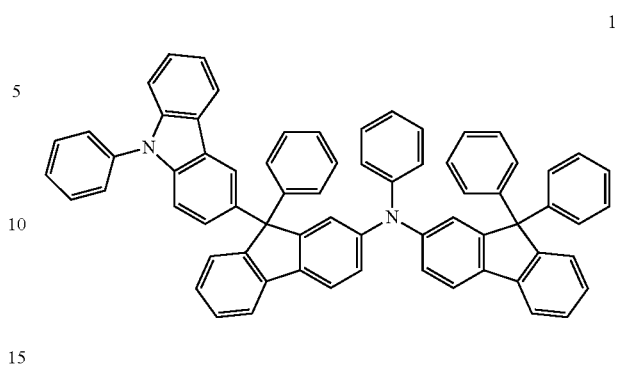

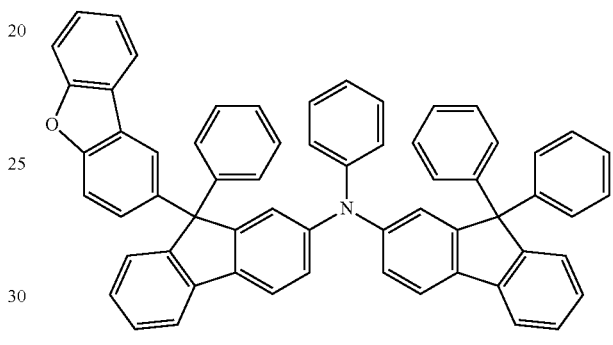

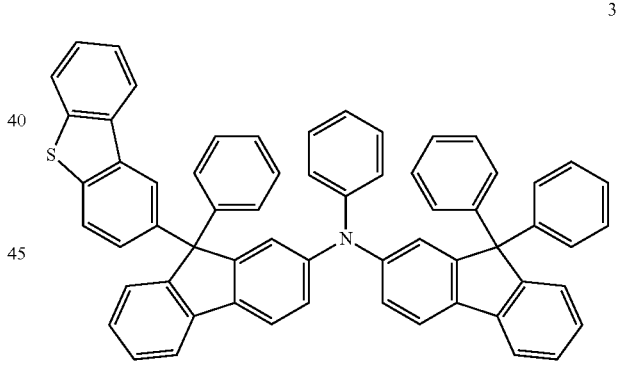

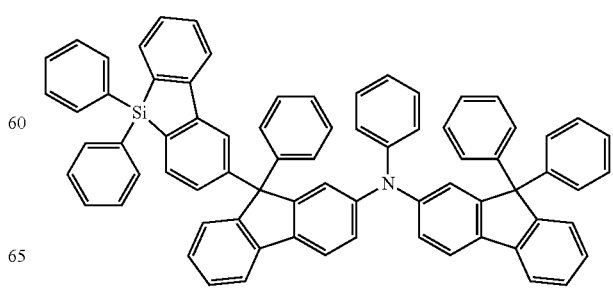

wherein, in the above structures,

Z is O, S, $NR_{13}$, $CR_{14}R_{15}$, or $SiR_{16}R_{17}$, $R_{13}$ to $R_{17}$ are each independently a hydrogen atom, a deuterium atom a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and

* is a binding site.

8. The amine compound as claimed in claim 1, wherein X is a substituted or unsubstituted phenyl group or a substituted or unsubstituted naphthyl group.

9. The amine compound as claimed in claim 1, wherein the amine compound represented by Formula 1 is one of the following Compounds 1 to 40:

-continued
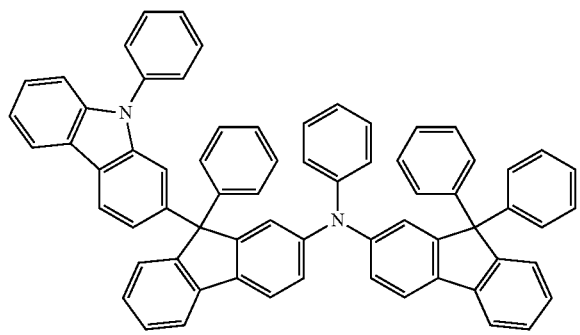
5
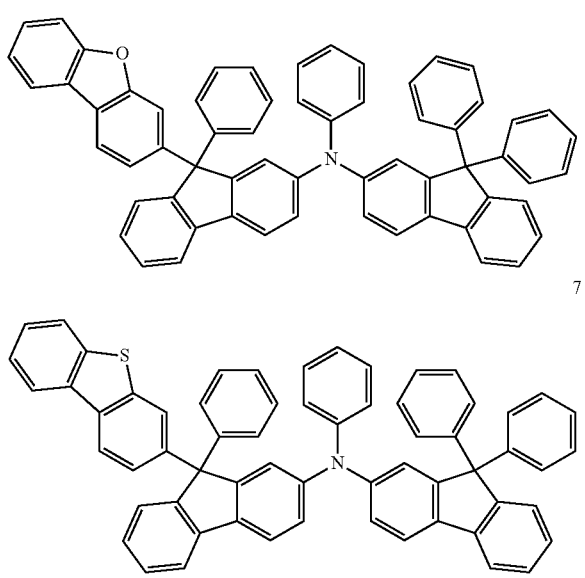
6
7
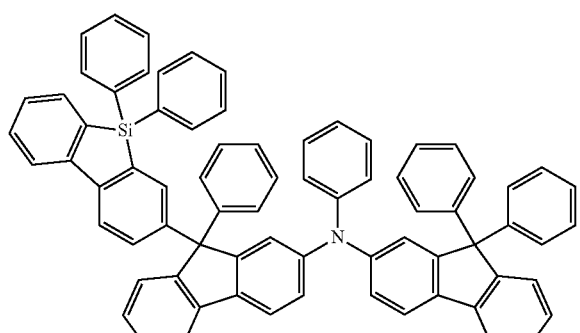
8
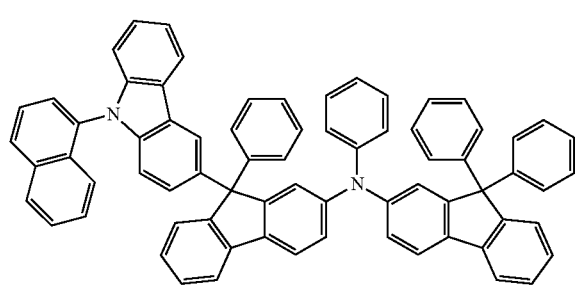
9
-continued
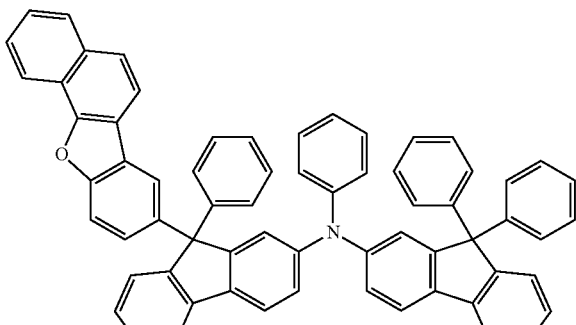
10
11
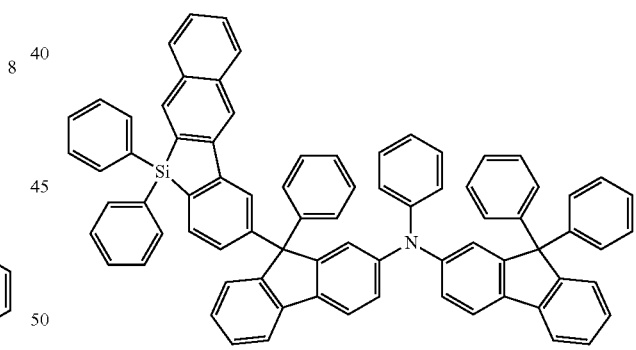
12
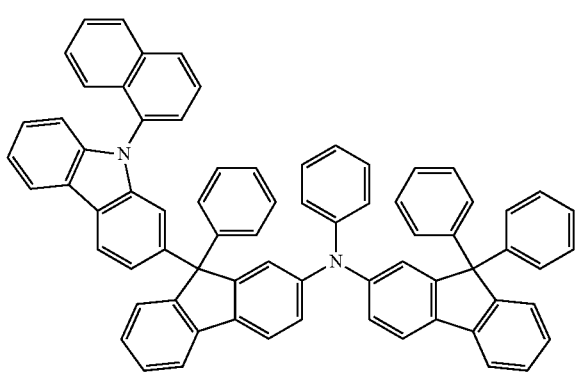
13

14
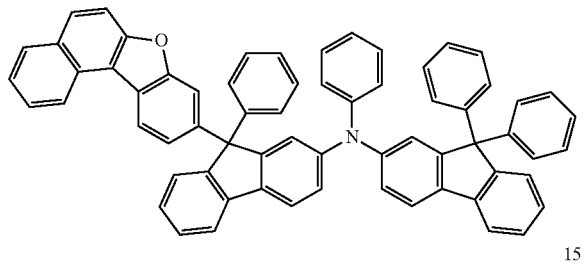
15
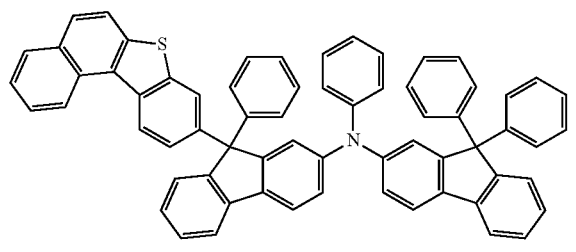
16
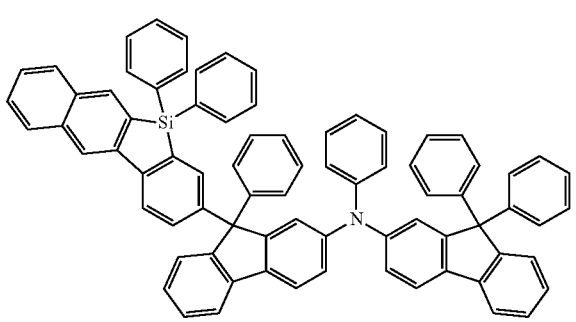
17
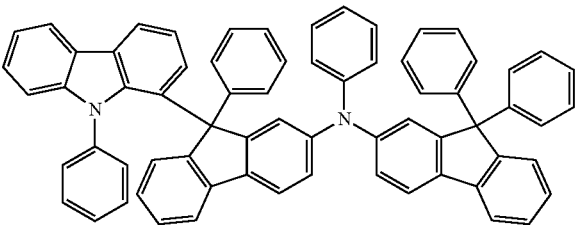
18
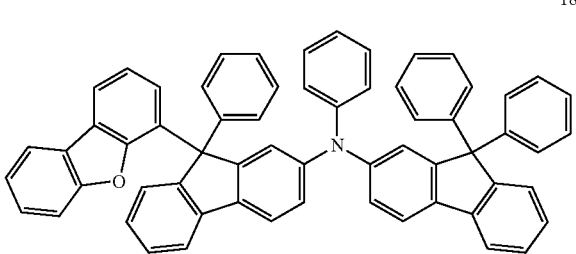
19
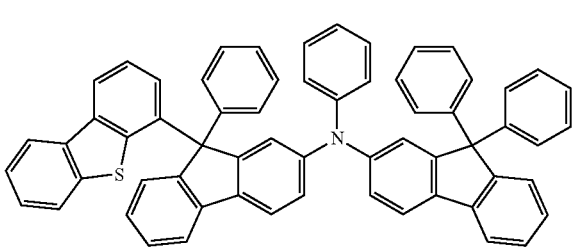
20
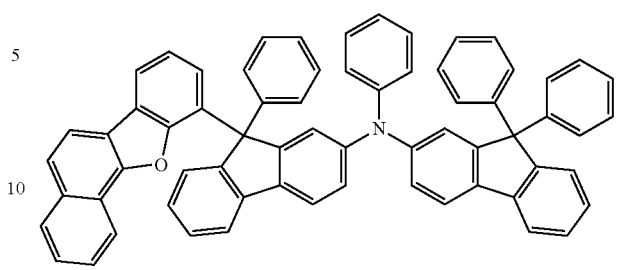
21
22
23
24
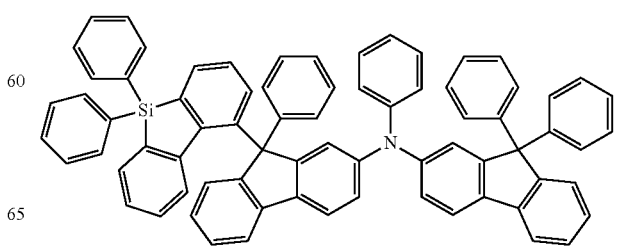

25
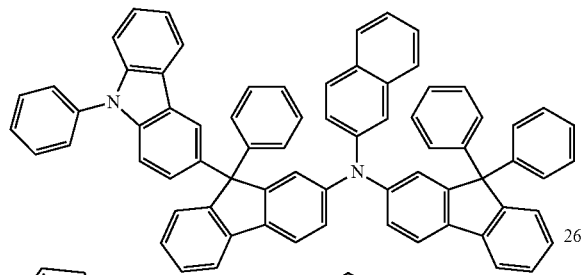
26
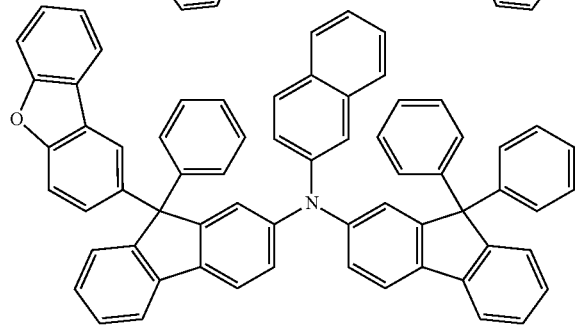
27
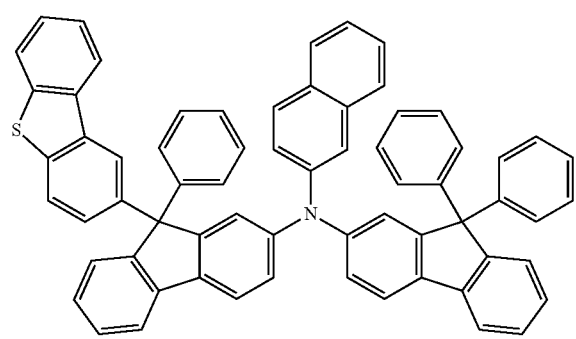
28
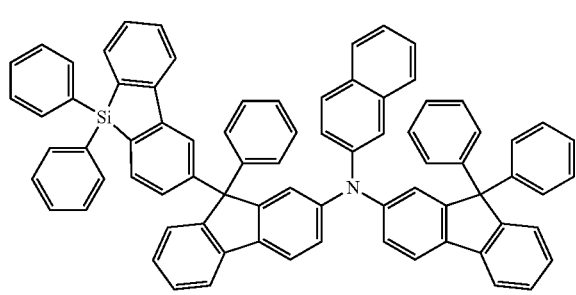
29
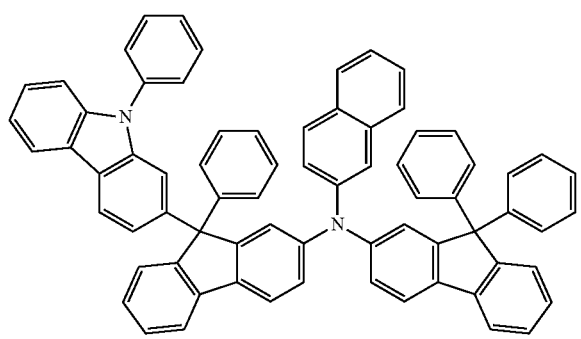
30
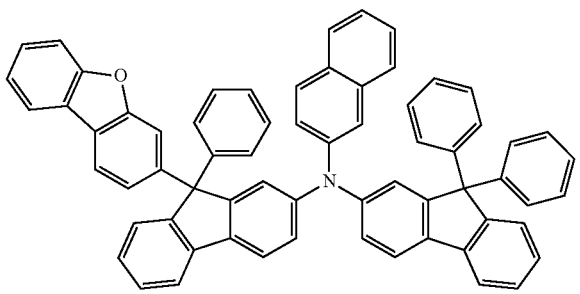
31
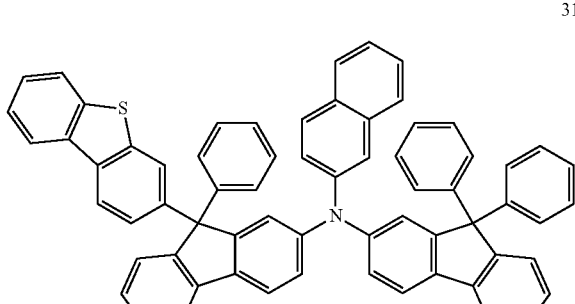
32
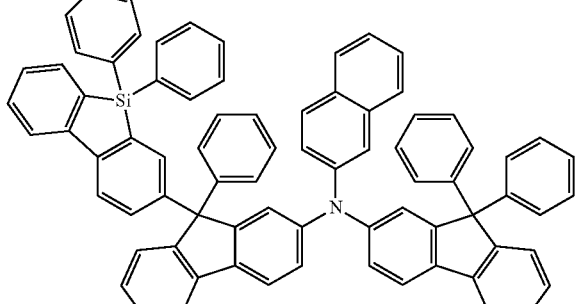
33
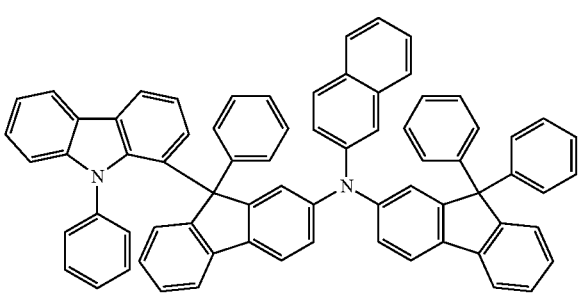
34
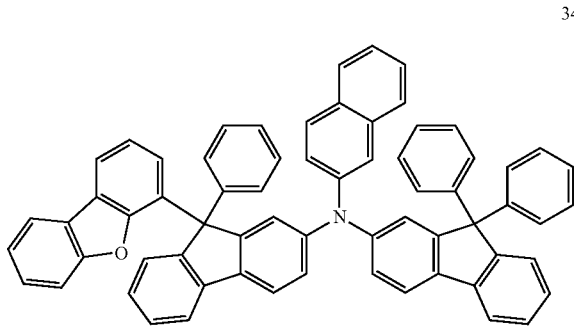

35

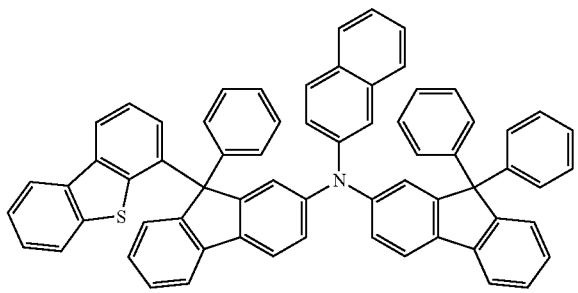

36

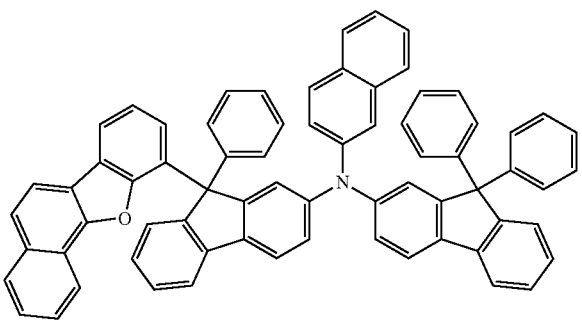

37

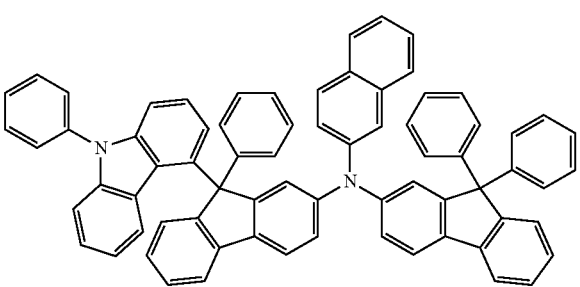

38

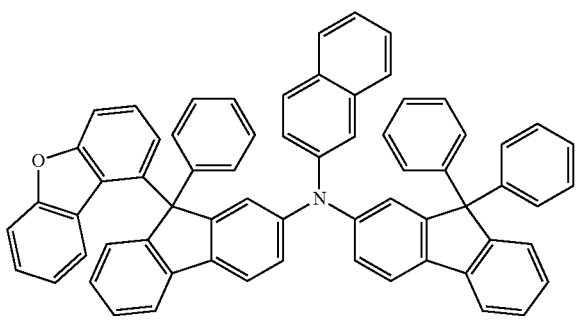

39

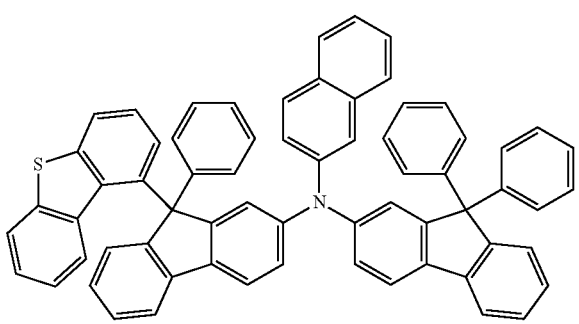

40

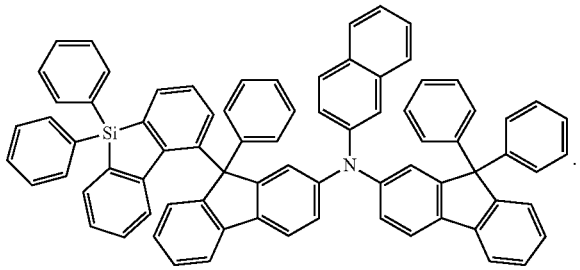

10. An organic electroluminescence device, comprising:
a first electrode;
a hole transport region on the first electrode;
an emission layer on the hole transport region;
an electron transport region on the emission layer; and
a second electrode on the electron transport region,
wherein the hole transport region includes a amine compound represented by the following Formula 1:

[Formula 1]

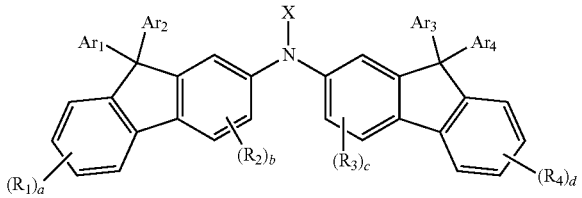

wherein in Formula 1,
$Ar_1$ to $Ar_4$ are each independently a substituted or unsubstituted aryl group having 6 to 30 ring carbon atoms or a substituted or unsubstituted heteroaryl group having 2 to 30 ring carbon atoms,
$Ar_1$ to $Ar_4$ are separate or are combined with an adjacent group to form a ring,
$R_1$ to $R_4$ are each independently a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms,
$R_1$ to $R_4$ are separate or are combined with an adjacent group to form a ring,
a and d are each independently an integer of 0 to 4,
b and c are each independently an integer of 0 to 3,
X is a substituted or unsubstituted aryl group having 6 to 30 ring carbon atoms or a substituted or unsubstituted heteroaryl group having 2 to 30 ring carbon atoms, and
at least one of $Ar_1$ to $Ar_4$ is a substituted or unsubstituted heteroaryl group having 2 to 30 ring carbon atoms.
11. The organic electroluminescence device as claimed in claim 10, wherein:
the hole transport region includes:
a hole injection layer on the first electrode; and
a hole transport layer on the hole injection layer,
the hole transport layer includes the amine compound represented by Formula 1.
12. The organic electroluminescence device as claimed in claim 10, wherein the amine compound represented by Formula 1 is represented by the following Formula 2:

[Formula 2]

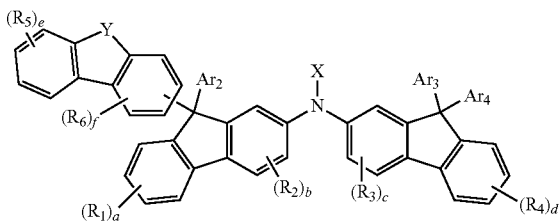

wherein in Formula 2,

Y is O, S, $SiR_7R_8$, or $NR_9$, $R_5$ to $R_9$ are each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_5$ to $R_9$ are separate or are combined with an adjacent group to form a ring, e is an integer of 0 to 4, f is an integer of 0 to 3, and $Ar_2$ to $Ar_4$, $R_1$ to $R_4$, a to d, and X are defined the same as those of Formula 1.

13. The organic electroluminescence device as claimed in claim 12, wherein the amine compound represented by Formula 2 is represented by the following Formula 2-1:

[Formula 2-1]

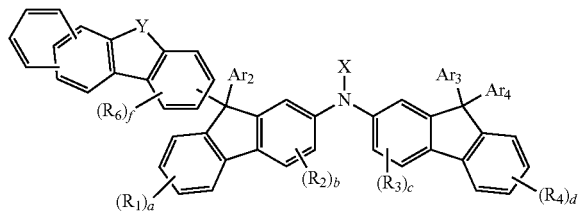

wherein in Formula 2-1, $Ar_1$ to $Ar_4$, $R_1$ to $R_4$, $R_6$, a to d, f, Y, and X are defined the same is those of Formula 2.

14. The organic electroluminescence device as claimed in claim 10, wherein the amine compound represented by Formula 1 is represented by the following Formula 3:

[Formula 3]

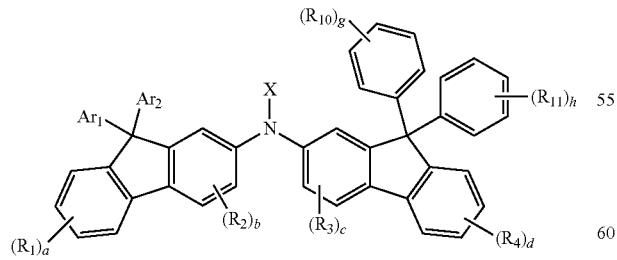

wherein in Formula 3, $R_{10}$ and $R_{11}$ are each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, g and h are each independently an integer of 0 to 5, $Ar_1$, $Ar_2$, X, $R_1$ to $R_4$, and a to d are defined the same as those of Formula 1, and at least one of $Ar_1$ and $Ar_2$ is a substituted or unsubstituted heteroaryl group having 2 to 30 ring carbon atoms.

15. The organic electroluminescence device as claimed in claim 10, wherein the amine compound represented by Formula 1 is represented by the following Formula 4:

[Formula 4]

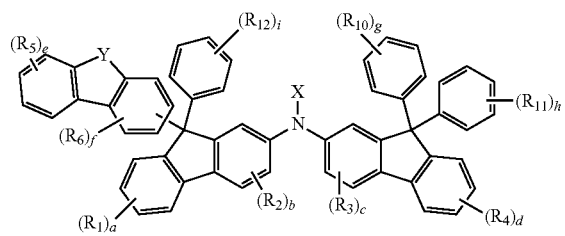

wherein in Formula 4,

Y is O, S, $SiR_7R_8$, or $NR_9$, $R_5$ to $R_{12}$ are each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_5$ to $R_{12}$ are separate or are combined with an adjacent group to form a ring, e is an integer of 0 to 4, f is an integer of 0 to 3, g to i are each independently an integer of 0 to 5, and $R_1$ to $R_4$, a to d, and X are defined the same as those of Formula 1.

16. The organic electroluminescence device as claimed in claim 10, wherein X is a group represented by one of the following structures:

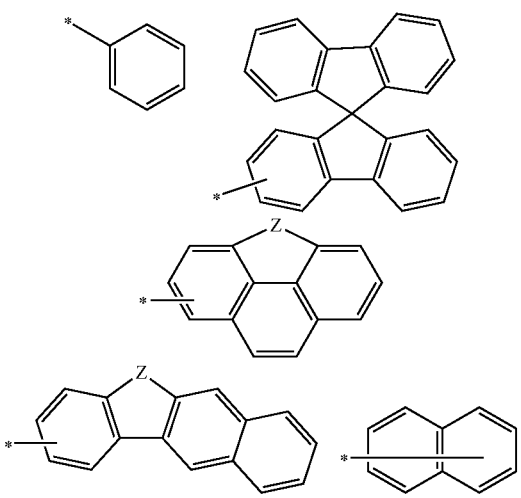

-continued

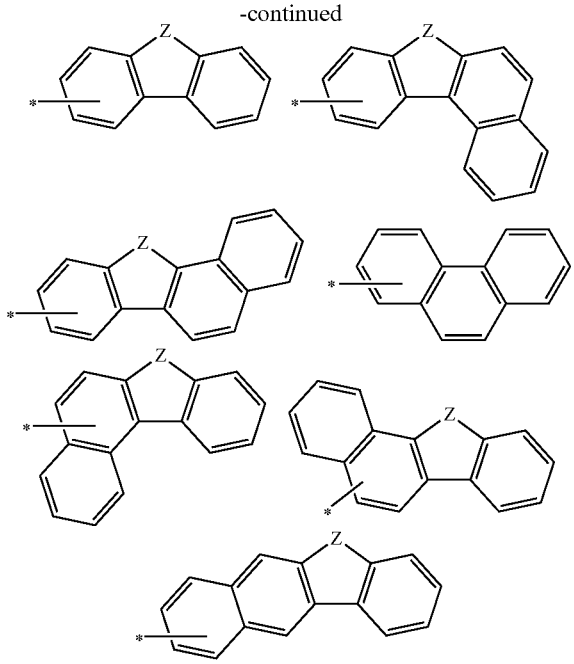

wherein, in the above structures,

Z is O, S, $NR_{13}$, $CR_{14}R_{15}$, or $SiR_{16}R_{17}$, $R_{13}$ to $R_{17}$ are each independently a hydrogen atom, a deuterium atom a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and

* is a binding site.

17. The organic electroluminescence device as claimed in claim 10, wherein X is a substituted or unsubstituted phenyl group or a substituted or unsubstituted naphthyl group.

18. The organic electroluminescence device as claimed in claim 10, wherein the amine compound represented by Formula 1 is one of the following Compounds 1 to 40:

1

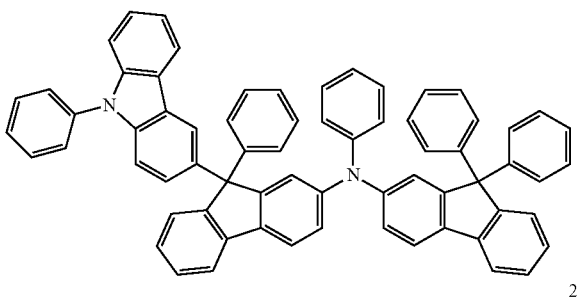

2

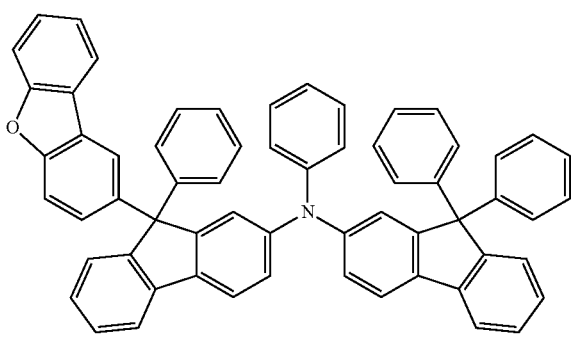

3

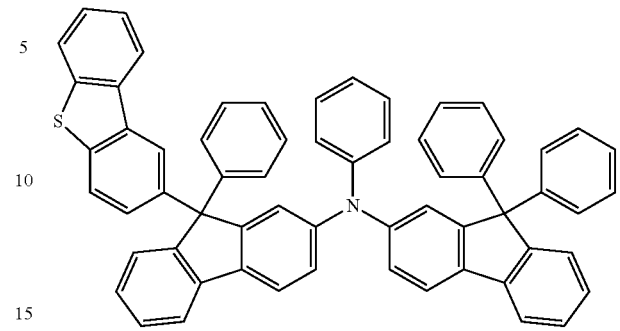

4

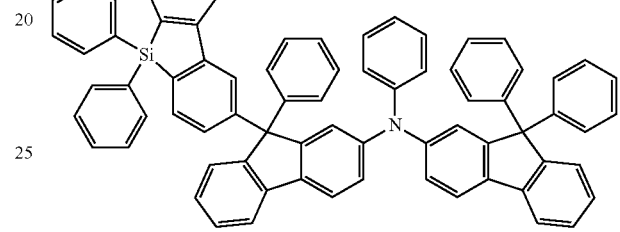

5

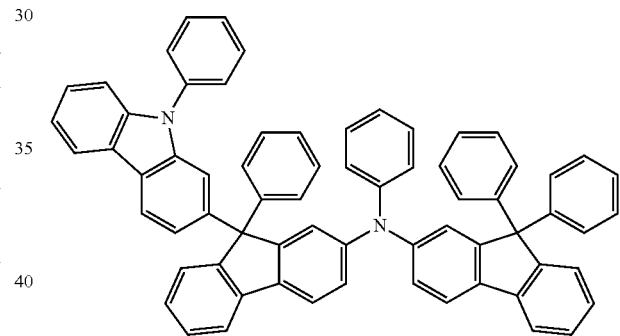

6

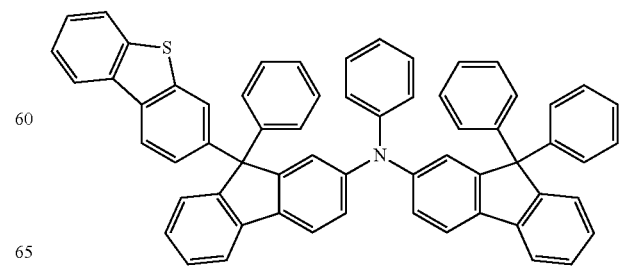

7

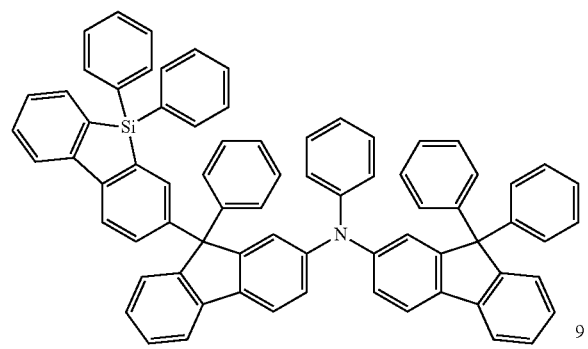
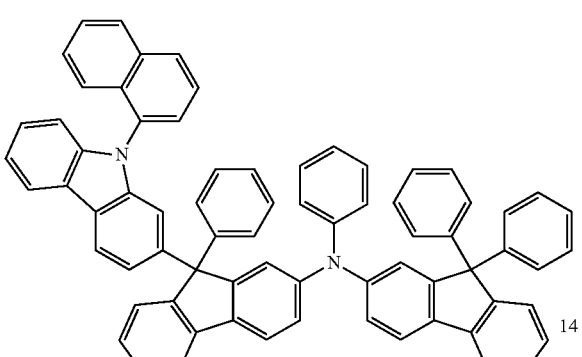
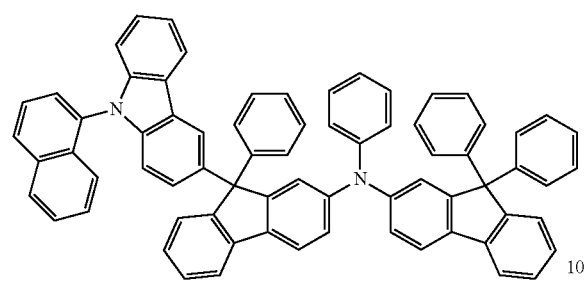
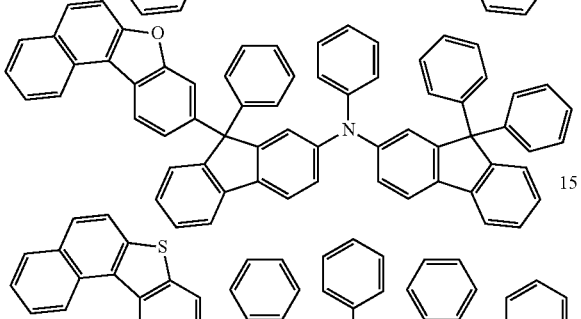
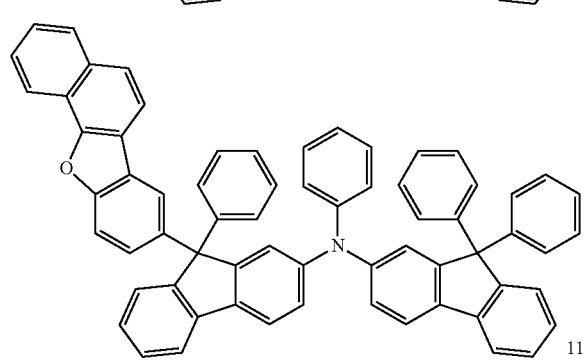
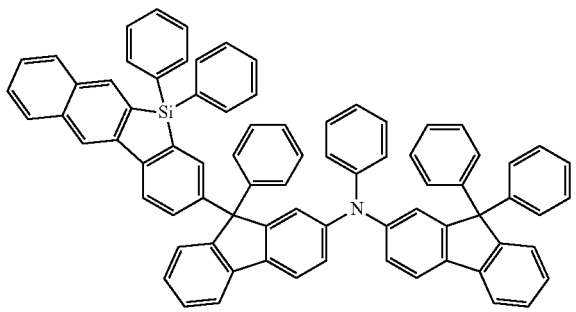
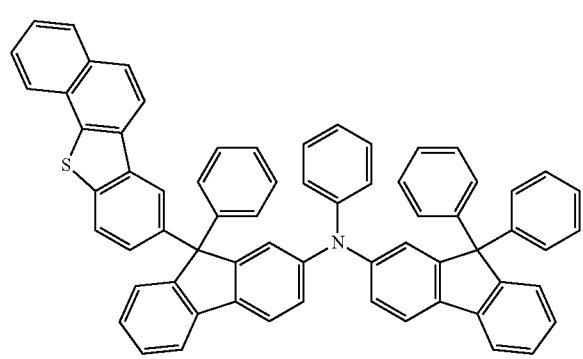
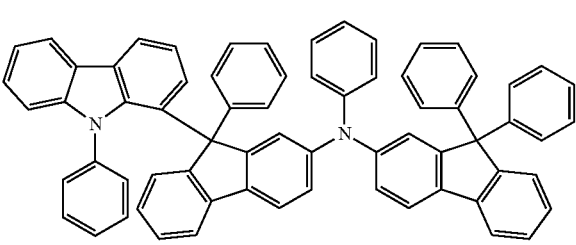
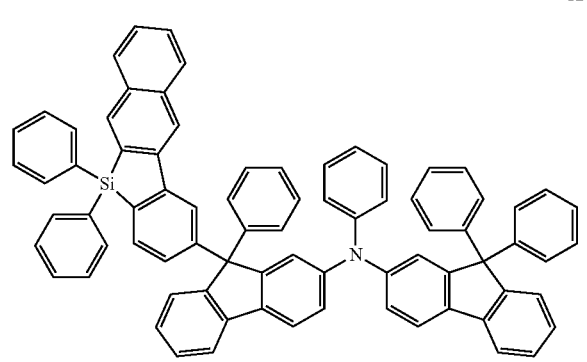
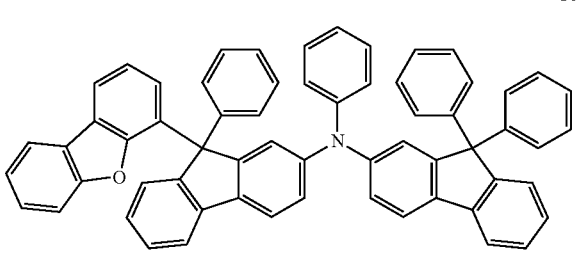

19
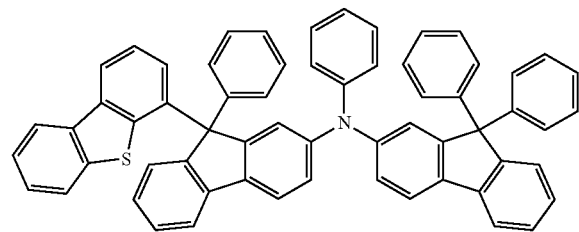
20
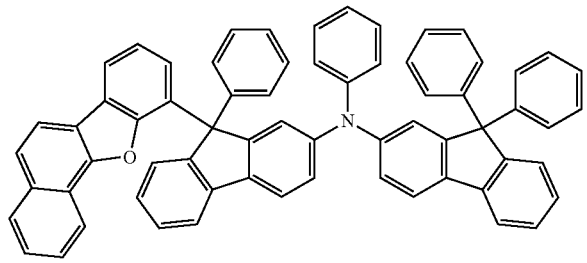
21
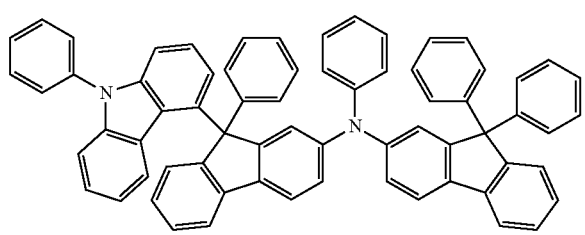
22
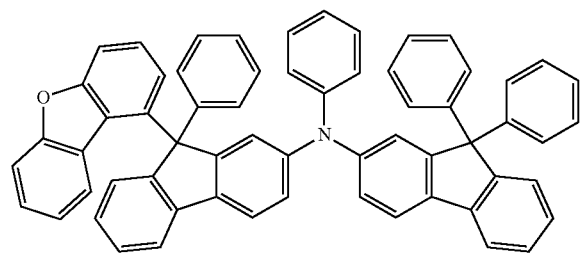
23
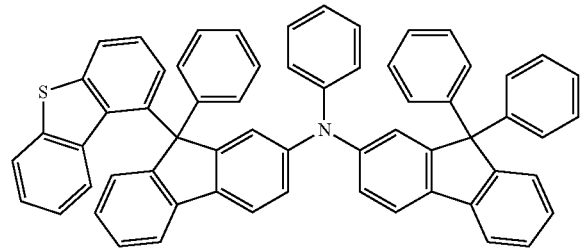
24
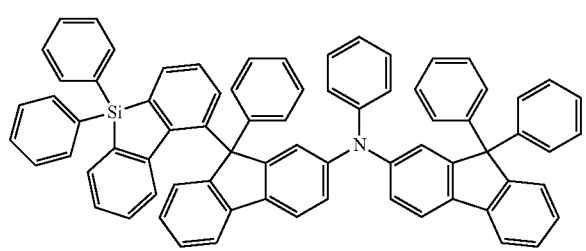
25
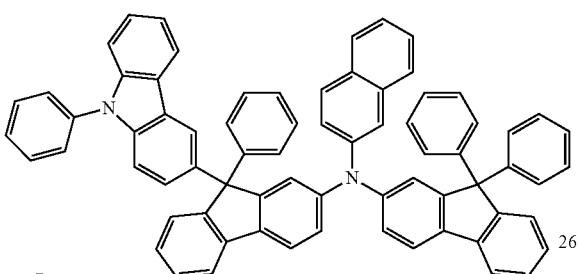
26
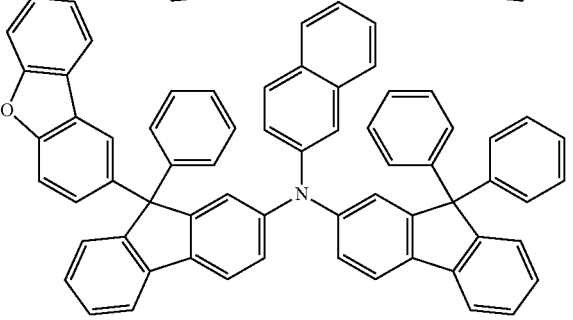
27
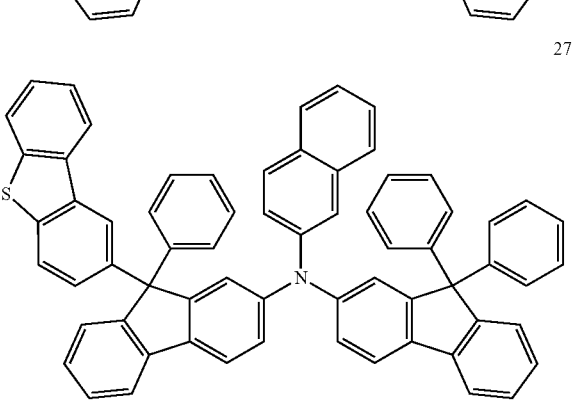
28
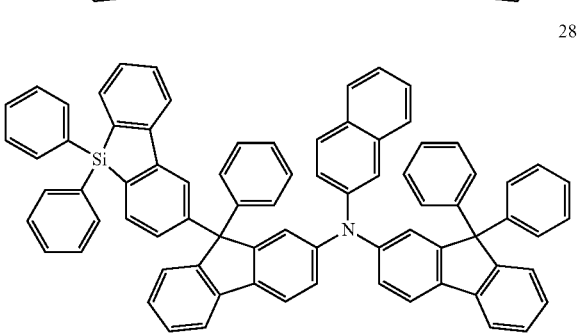
29
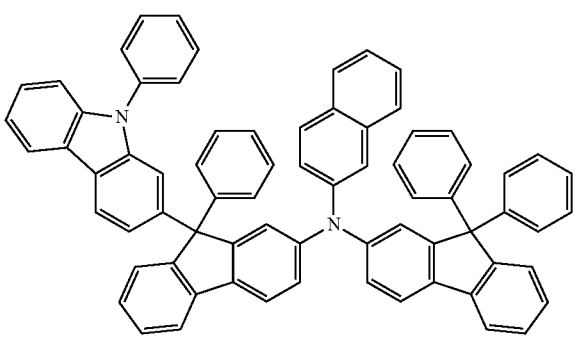

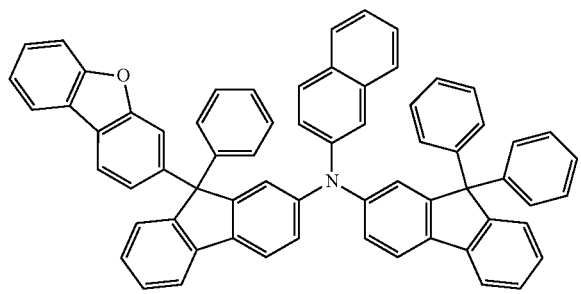
30
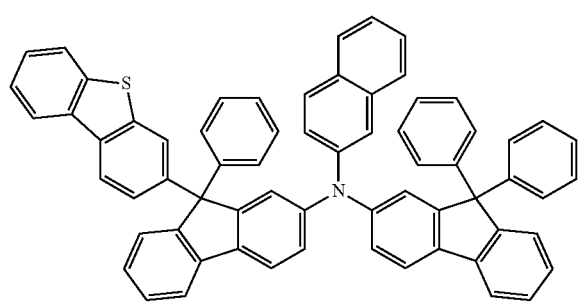
31
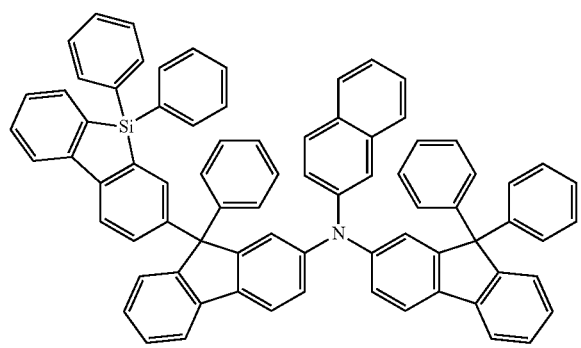
32
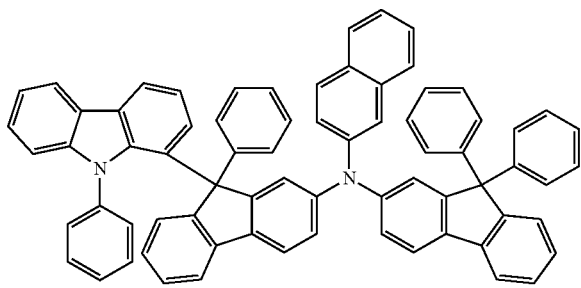
33
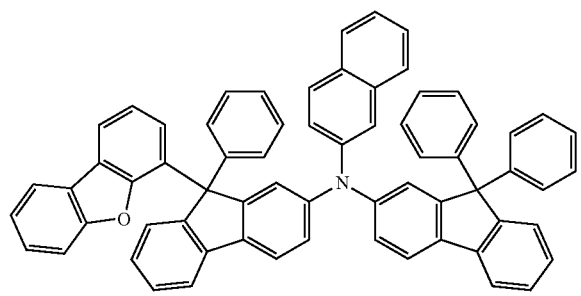
34
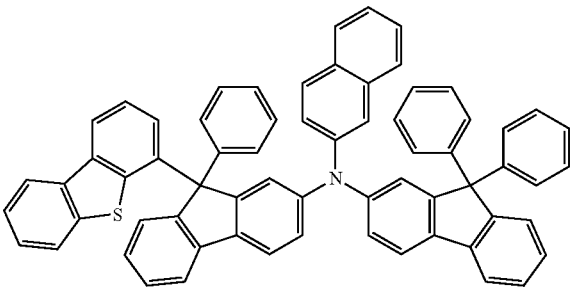
35
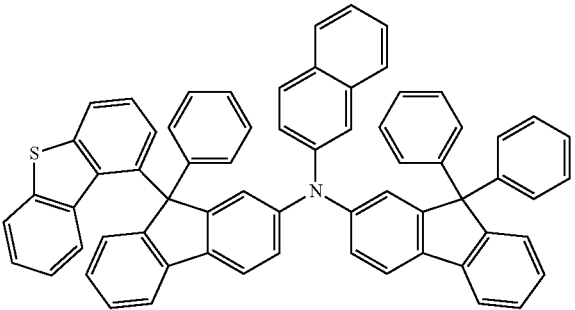
36
37
38
39